United States Patent
Liu et al.

(10) Patent No.: US 12,225,786 B2
(45) Date of Patent: Feb. 11, 2025

(54) DISPLAY PANEL AND DISPLAY DEVICE EACH HAVING AN UPPER CATHODE LAYER INCLUDING A PLURALITY OF SPACED-APART CATHODE PATTERNS CONNECTED TO LOWER SECOND CATHODE LAYER VIA FIRST CONNECTION PORTION

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cong Liu, Beijing (CN); Yao Huang, Beijing (CN); Binyan Wang, Beijing (CN); Weiyun Huang, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 768 days.

(21) Appl. No.: 17/437,917

(22) PCT Filed: Dec. 1, 2020

(86) PCT No.: PCT/CN2020/133160
§ 371 (c)(1),
(2) Date: Sep. 10, 2021

(87) PCT Pub. No.: WO2022/116010
PCT Pub. Date: Jun. 9, 2022

(65) Prior Publication Data
US 2022/0352289 A1 Nov. 3, 2022

(51) Int. Cl.
H10K 59/131 (2023.01)
H10K 50/822 (2023.01)
H10K 59/35 (2023.01)

(52) U.S. Cl.
CPC ......... H10K 59/131 (2023.02); H10K 50/822 (2023.02); *H10K 59/351* (2023.02)

(58) Field of Classification Search
CPC ... H10K 59/131; H10K 50/822; H10K 59/351
See application file for complete search history.

(56) References Cited

U.S. PATENT DOCUMENTS

| 11,698,694 B2 * | 7/2023 | Lee | G06F 3/0446 |
| | | | 345/173 |
| 2014/0209891 A1 * | 7/2014 | Hiraoka | H10K 50/82 |
| | | | 438/4 |

(Continued)

FOREIGN PATENT DOCUMENTS

| CN | 107992225 A | 5/2018 |
| CN | 108417609 A | 8/2018 |

(Continued)

*Primary Examiner* — Michael Jung
(74) *Attorney, Agent, or Firm* — Lippes Mathias LLP

(57) ABSTRACT

Disclosed is a display panel, including: a base substrate including a first display region, a second display region, and a routing region: a first anode layer, a first light-emitting layer and a first cathode layer disposed in the first display region and sequentially stacked in a direction going away from the base substrate; a second cathode layer, a second anode layer, a second light-emitting layer, and a third cathode layer disposed in the second display area and sequentially stacked in the direction going away from the base substrate, and a first signal transmission layer disposed in the routing region; wherein the first signal transmission layer is connected to the second cathode layer and the first cathode layer, and the first signal transmission layer is further configured to receive a power supply signal.

20 Claims, 21 Drawing Sheets

(56) References Cited

U.S. PATENT DOCUMENTS

| | | | |
|---|---|---|---|
| 2019/0157355 | A1 | 5/2019 | Ye |
| 2019/0312098 | A1* | 10/2019 | Matsueda ............ H10K 59/353 |
| 2020/0135837 | A1 | 4/2020 | Cui et al. |
| 2020/0203446 | A1 | 6/2020 | Luo |
| 2023/0083099 | A1* | 3/2023 | Xu ..................... H10K 59/8052 |
| | | | 257/79 |

FOREIGN PATENT DOCUMENTS

| | | |
|---|---|---|
| CN | 110265461 A | 9/2019 |
| CN | 110491918 A | 11/2019 |
| CN | 110828533 A | 2/2020 |
| CN | 111785742 A | 10/2020 |
| CN | 111863904 A | 10/2020 |
| JP | 2010118253 A | 5/2010 |

\* cited by examiner

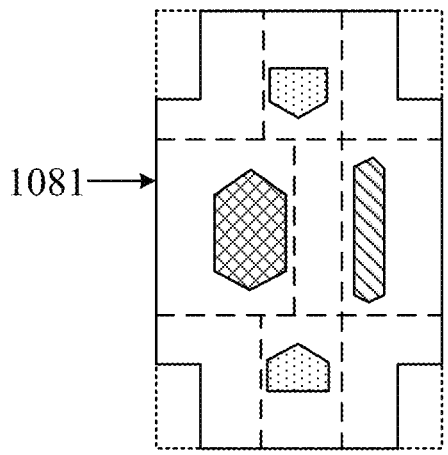

Light-emitting region of first sub-pixel of a first color

Light-emitting region of first sub-pixel of a second color

Light-emitting region of first sub-pixel of a third color

FIG. 5

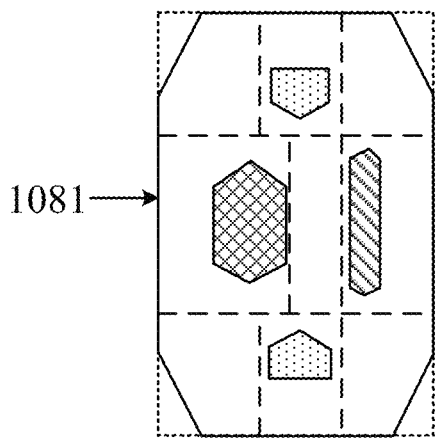

Light-emitting region of first sub-pixel of a first color

Light-emitting region of first sub-pixel of a second color

Light-emitting region of first sub-pixel of a third color

FIG. 6

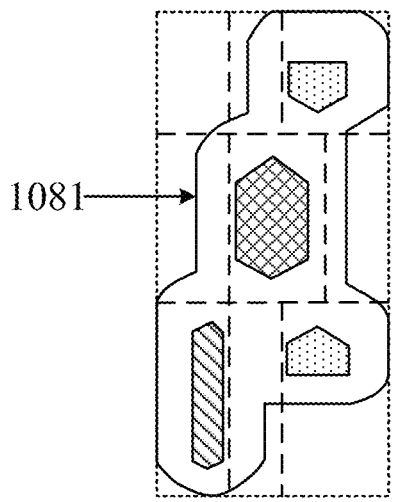

Light-emitting region of first sub-pixel of a first color

Light-emitting region of first sub-pixel of a second color

Light-emitting region of first sub-pixel of a third color

FIG. 7

DISPLAY PANEL AND DISPLAY DEVICE EACH HAVING AN UPPER CATHODE LAYER INCLUDING A PLURALITY OF SPACED-APART CATHODE PATTERNS CONNECTED TO LOWER SECOND CATHODE LAYER VIA FIRST CONNECTION PORTION

CROSS-REFERENCE TO RELATED APPLICATIONS

This application is a US national stage of international application No. PCT/CN2020/133160, filed on Dec. 1, 2020, the disclosure of which is herein incorporated by reference in its entirety.

TECHNICAL FIELD

The present disclosure relates to the field of display technologies, and in particular, relates to a display panel and a display device.

BACKGROUND

Organic light-emitting diode (OLED) display panels have been widely used because of the advantages such as self-luminescence, low driving voltage, and high response speed.

SUMMARY

The present disclosure provides a display panel and a display device. The technical solutions are as follows.

In one aspect, a display panel is provided. The display panel includes:
a base substrate including a first display region, a second display region, and a routing region;
a first anode layer, a first light-emitting layer, and a first cathode layer that are disposed in the first display region and sequentially stacked in a direction going away from the base substrate;
a second cathode layer, a second anode layer, a second light-emitting layer, and a third cathode layer that are disposed in the second display region and sequentially stacked in the direction going away from the base substrate, wherein the third cathode layer includes: a plurality of first cathode patterns spaced apart, the first cathode pattern including a first connecting portion, the first cathode pattern being connected to the second cathode layer via the first connecting portion; the second anode layer, the second light-emitting layer and the third cathode layer are dividable into a plurality of first sub-pixels, an orthographic projection of a light-emitting region of the first sub-pixel on the base substrate being within an overlapping region between the second cathode layer and the third cathode layer; and
a first signal transmission layer disposed in the routing region, wherein a signal transmitted by the first signal transmission layer is different from signals transmitted by the first anode layer and the second anode layer;
wherein an orthographic projection of the first signal transmission layer on the base substrate is partially overlapped with an orthographic projection of the second cathode layer on the base substrate, the first signal transmission layer includes: a second connecting portion, the first signal transmission layer being connected to the second cathode layer via the second connecting portion; the orthographic projection of the first signal transmission layer on the base substrate is partially overlapped with an orthographic projection of the first cathode layer on the base substrate, and the first signal transmission layer is connected to the first cathode layer; and the first signal transmission layer is further configured to receive a power supply signal.

Optionally, an orthographic projection of the first cathode pattern on the base substrate covers the orthographic projection of the light-emitting region of at least one of the first sub-pixels on the base substrate.

Optionally, the first anode layer, the first light-emitting layer, and the first cathode layer are dividable into a plurality of second sub-pixels, wherein an orthographic projection of a light-emitting region of the second sub-pixel on the base substrate is within the orthographic projection of the first cathode layer on the base substrate.

Optionally, the first sub-pixels are categorizable into a plurality of sub-pixel groups, wherein each of the sub-pixel groups includes a plurality of first sub-pixels, and light-emitting regions of the first sub-pixels in at least one of the sub-pixel groups are arranged in three rows and three columns.

Optionally, the orthographic projection of the first cathode pattern on the base substrate covers an orthographic projection of one sub-pixel group on the base substrate, and a shape of the first cathode pattern is a first shape, wherein the first shape is a centrosymmetric shape or an axisymmetric shape.

Optionally, the orthographic projection of the first cathode pattern on the base substrate covers an orthographic projection of one sub-pixel group on the base substrate, and a shape of the first cathode pattern is a second shape; wherein the second shape is formed by connecting a plurality of straight line segments and a plurality of are line segments end to end, and an extending direction of at least one of the straight line segments is parallel to an extending direction of a boundary of the light-emitting region of at least one of the first sub-pixels in the sub-pixel group.

Optionally, the sub-pixel group includes: one first sub-pixel of a first color, two first sub-pixels of a second color, and one first sub-pixel of a third color.

Optionally, in at least one of the sub-pixel groups, the light-emitting region of the first sub-pixel of the first color is disposed in row 3 and column 1, the light-emitting region of one first sub-pixel of the second color is disposed in row 1 and column 3, the light-emitting region of the other first sub-pixel of the second color is disposed in row 3 and column 3, and the light-emitting region of the first sub-pixel of the third color is disposed in row 2 and column 2.

Optionally, in at least one of the sub-pixel groups, the light-emitting region of the first sub-pixel of the first color is disposed in row 2 and column 3, the light-emitting region of one first sub-pixel of the second color is disposed in row 1 and column 2, the light-emitting region of the other first sub-pixel of the second color is disposed in row 3 and column 2, and the light-emitting region of the first sub-pixel of the third color is disposed in row 2 and column 1.

Optionally, in at least one of the sub-pixel groups, a distance between the first connecting portion and the light-emitting region of at least one of the first sub-pixels in the sub-pixel group in a direction parallel to a bearing surface of the base substrate is greater than or equal to 25 microns and less than or equal to 15 microns.

Optionally, the second cathode layer includes: a joint, an orthographic projection of the joint on the base substrate being partially overlapped with the orthographic projection of the first signal transmission layer on the base substrate; and the display panel further includes: a first overcoat disposed between the second cathode layer and the third cathode layer, wherein the first overcoat is provided with a plurality of first via holes and a plurality of second via holes; wherein an orthographic projection of the first via hole on the base substrate is within the second display region, the orthographic projection of the first via hole on the base substrate is not overlapped with the orthographic projection of the light-emitting region of the first sub-pixel on the base substrate, and part of the first connecting portion is disposed in the first via hole; and an orthographic projection of the second via hole on the base substrate is within the routing region, the orthographic projection of the second via hole on the base substrate is within the orthographic projection of the joint on the base substrate, and is within the orthographic projection of the first signal transmission layer on the base substrate, and part of the second connecting portion is disposed in the second via hole.

Optionally, the display panel further includes: a plurality of pixel circuits disposed in the first display region, and a second signal transmission layer disposed between the first overcoat and the third cathode layer; wherein the pixel circuit is electrically connected to the second anode layer via the second signal transmission layer.

Optionally, the second signal transmission layer includes: a plurality of transmission traces; wherein one end of the transmission trace is connected to the second anode layer, and the other end of the transmission trace is connected to the pixel circuit.

Optionally, the second signal transmission layer further includes: a plurality of first transmission patterns disposed in the second display region, wherein the first transmission pattern is disposed in the first via hole and configured to electrically connect the second cathode layer and the first connecting portion.

Optionally, the second signal transmission layer further includes: a plurality of second transmission patterns disposed in the routing region, wherein the second transmission pattern is disposed in the second via hole and configured to electrically connect the second cathode layer and the second connecting portion.

Optionally, the display panel further includes: a second overcoat disposed between the second signal transmission layer and the third cathode layer; wherein the second overcoat is provided with a plurality of third via holes, a first overlapping region being defined between an orthographic projection of the third via hole on the base substrate and the orthographic projection of the first via hole on the base substrate, a ratio of an area of the first overlapping region to an area of the orthographic projection of the first via hole on the base substrate being greater than or equal to 80%, and part of the first connecting portion being disposed in the third via hole and configured to connect the second signal transmission layer and the third cathode layer; and the second overcoat is further provided with a plurality of fourth via holes, a second overlapping region being defined between an orthographic projection of the fourth via hole on the base substrate and the orthographic projection of the second via hole on the base substrate, a ratio of an area of the second overlapping region to an area of the orthographic projection of the second via hole on the base substrate being greater than or equal to 80%, and part of the second connecting portion being disposed in the fourth via hole and configured to connect the first signal transmission layer and the second signal transmission layer.

Optionally, the second overcoat is further provided with a plurality of fifth via holes; the second anode layer includes: a third connecting portion disposed in the fifth via hole, wherein the second anode layer is electrically connected to the second signal transmission layer via the third connecting portion.

Optionally, the display panel further includes: a pixel define layer; wherein the pixel define layer is provided with a plurality of sixth via holes, an orthographic projection of the sixth via hole on the base substrate being covered by an orthographic projection of the first light-emitting layer on the base substrate, and the first light-emitting layer being in contact with the first anode layer via the sixth via hole; and the pixel define layer is further provided with a plurality of seventh via holes, an orthographic projection of the seventh via hole on the base substrate being covered by an orthographic projection of the second light-emitting layer on the base substrate, and the second light-emitting layer being in contact with the second anode layer via the seventh via hole.

Optionally, the pixel define layer is further provided with a plurality of eighth via holes, wherein a third overlapping region is defined between an orthographic projection of the eighth via hole on the base substrate and the orthographic projection of the first via hole on the base substrate, and a ratio of an area of the third overlapping region to the area of the orthographic projection of the first via hole on the base substrate is greater than or equal to 80%.

Optionally, the pixel define layer is further provided with a plurality of ninth via holes, wherein an orthographic projection of the ninth via hole on the base substrate is within the orthographic projection of the first signal transmission layer on the base substrate; and the first cathode layer is electrically connected to the first signal transmission layer via the ninth via hole.

Optionally, the display panel further includes: a third overcoat disposed on a side, proximal to the base substrate, of the second cathode layer; and the first signal transmission layer is provided with a plurality of tenth via holes, wherein the third overcoat is exposed by the tenth via hole.

Optionally, an orthographic projection of the second connecting portion on the base substrate surrounds an orthographic projection of the tenth via hole on the base substrate.

Optionally, the third cathode layer further includes: a plurality of second cathode patterns spaced apart, wherein an orthographic projection of the second cathode patterns on the base substrate is not overlapped with the orthographic projection of the light-emitting region of the first sub-pixel on the base substrate.

Optionally, the display panel further includes: a first hole transport layer and a first electron transport layer disposed in the first display region, and a second hole transport layer and a second electron transport layer disposed in the second display region; wherein the second hole transport layer includes a plurality of hole transport patterns spaced apart, an area of the hole transport pattern being smaller than an area of the first cathode pattern; and the second electron transport layer includes a plurality of electron transport patterns spaced apart, an area of the electron transport pattern being smaller than the area of the first cathode pattern.

Optionally, an orthographic projection of the hole transport pattern on the base substrate covers the orthographic projection of the light-emitting region of the first sub-pixel on the base substrate, and an orthographic projection of the electron transport pattern on the base substrate covers the orthographic projection of the light-emitting region of the first sub-pixel on the base substrate; and the orthographic projection of the hole transport pattern on the base substrate is not overlapped with an orthographic projection of the first connecting portion on the base substrate, and the orthographic projection of the electron transport pattern on the base substrate is not overlapped the orthographic projection of the first connecting portion on the base substrate.

Optionally, the second cathode layer and the second signal transmission layer in the display panel are both made of a transparent conductive material.

Optionally, the first anode layer, the second anode layer, and the first signal transmission layer are disposed in the same layer; the first light-emitting layer and the second light-emitting layer are disposed in the same layer; and the first cathode layer and the third cathode layer are disposed in the same layer.

In another aspect, a display device is provided. The display device includes: an image sensor and any one of the display panels according to the above aspect; wherein the image sensor is disposed on a side, distal from a second anode layer, of the base substrate in the display panel, and disposed in a third display region of the base substrate.

BRIEF DESCRIPTION OF THE DRAWINGS

For clearer illustration of the technical solutions in the embodiments of the present disclosure, accompanying drawings required for describing the embodiments are briefly introduced hereinafter. Apparently, the accompanying drawings described hereinafter merely illustrate some embodiments of the present disclosure, and those ordinary skilled in the art may derive other drawings from these accompanying drawings without creative efforts.

FIG. 5 is a schematic diagram of another first cathode pattern and light-emitting region of the first sub-pixel according to an embodiment of the present disclosure:

FIG. 6 is a schematic diagram of yet another first cathode pattern and light-emitting region of the first sub-pixel according to an embodiment of the present disclosure;

FIG. 7 is a schematic diagram of still a further first cathode pattern and light-emitting region of the first sub-pixel according to an embodiment of the present disclosure;

DETAILED DESCRIPTION

For clearer descriptions of the objectives, technical solutions, and advantages of the present disclosure, embodiments of the present disclosure are described in detail hereinafter with reference to the accompanying drawings.

In the related art, a camera of a display device may be disposed in a display region of a display panel to increase a screen-to-body ratio of the display panel. The display region of the display panel includes: an anode layer, a light-emitting layer, and a cathode layer that are sequentially stacked in a direction going away from a base substrate. The camera is disposed on a side of the anode layer distal from the light-emitting layer.

However, the cathode layer will affect a transmittance, thus an imaging effect of the camera disposed in the display region of the display panel being poor.

Figure 1:
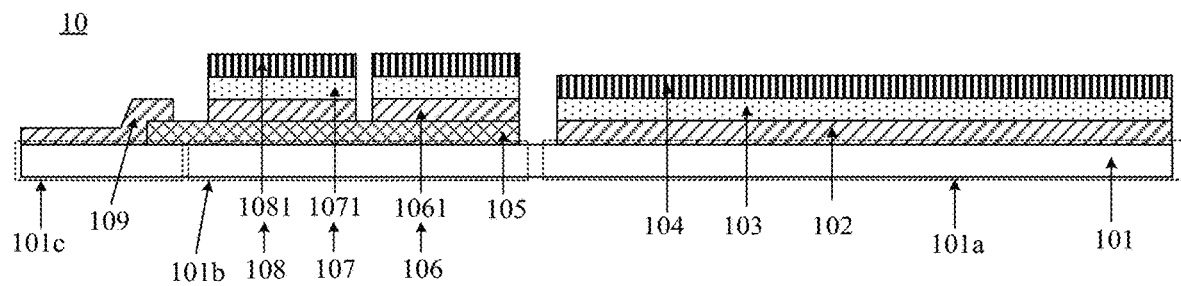
FIG. 1 is a schematic structural diagram of a display panel according to an embodiment of the present disclosure.

FIG. 1 is a schematic structural diagram of a display panel according to an embodiment of the present disclosure. Referring to FIG. 1, a display panel 10 may include: a base substrate 101, a first anode layer 102, a first light-emitting layer 103, a first cathode layer 104, a second cathode layer 105, a second anode layer 106, a second light-emitting layer 107, a third cathode layer 108, and a first signal transmission layer 109.

Figure 2:
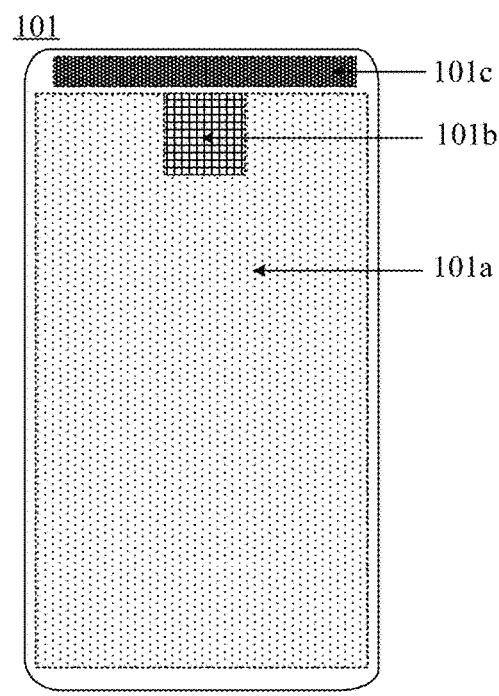
FIG. 2 is a top view of a base substrate according to an embodiment of the present disclosure.

FIG. 2 is a top view of a base substrate according to an embodiment of the present disclosure. In combination with FIG. 1 and FIG. 2, the base substrate 101 may include a first display region 101a, a second display region 101b, and a routing region 101c. The first anode layer 102, the first light-emitting layer 103, and the first cathode layer 104 may be disposed in the first display region 101a, and sequentially stacked in a direction going away from the base substrate 101. The second cathode layer 105, the second anode layer 106, the second light-emitting layer 107, and the third cathode layer 108 may be disposed in the second display region 101b, and sequentially stacked in the direction going away from the base substrate 101. The first signal transmission layer 109 may be disposed in the routing region 101c, and a signal transmitted by the first signal transmission layer 109 being different from signals transmitted by the first anode layer 102 and the second anode layer 106.

Referring to FIG. 2, the routing region 101c is a strip-shaped region and disposed on the same side of the first display region 101a and the second display region 101b. In addition, the routing region 101c may be a ring-shaped region surrounding the first display region 101a and the second display region 101b. The shape of the routing region 101c is not limited in the embodiments of the present disclosure.

Figure 3:
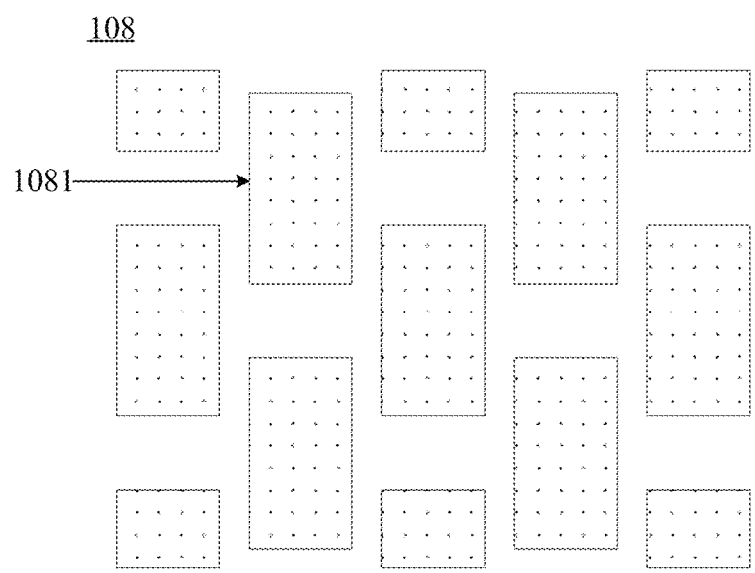
FIG. 3 is a schematic diagram of a portion of a third cathode layer according to an embodiment of the present disclosure.

FIG. 3 is a schematic diagram of a portion of a third cathode layer according to an embodiment of the present disclosure. Referring to FIG. 3, the third cathode layer 108 may include a plurality of first cathode patterns 1081 spaced apart. The first cathode pattern 1081 may include a first connecting portion (not shown in the drawing). The first cathode pattern 1081 may be connected to the second cathode layer 105 via the first connecting portion.

Optionally, the second anode layer 106, the second light-emitting layer 107, and the third cathode layer 108 may be divided into a plurality of first sub-pixels. An orthographic projection of a light-emitting region of the first sub-pixel on the base substrate 101 is within an overlapping region between the second cathode layer 105 and the third cathode layer 108.

Referring to FIG. 1, the second anode layer 106 may include a plurality of anode patterns 1061. The second light-emitting layer 107 may include a plurality of light-emitting layer patterns 1071. In addition, the anode patterns 1061, the light-emitting layer patterns 1071, and the first cathode patterns 1081 may correspond to each other. Each anode pattern 1061, one corresponding light-emitting layer pattern 1071 and one corresponding first cathode pattern 1081 may form a first sub-pixel. Two adjacent anode patterns 1061 may correspond to the same first cathode pattern 1081, or may respectively correspond to two different first cathode patterns 1081, which is not limited in the embodiment of the present disclosure.

In the embodiment of the present disclosure, referring to FIG. 1, an orthographic projection of the first signal transmission layer 109 on the base substrate 101 is partially overlapped with an orthographic projection of the second cathode layer 105 on the base substrate 101. The first signal transmission layer 109 includes: a second connecting portion (not shown in the drawing). The first signal transmission layer 109 may be connected to the second cathode layer 105 via the second connecting portion. The first signal transmission layer 109 is further configured to receive a power supply signal.

That is, the second cathode layer 105 is connected to the first cathode pattern 1081 of the third cathode layer 108, and the second cathode layer 105 is further connected to the first signal transmission layer 109. Thus, the first signal transmission layer 109 may be connected to the first cathode pattern 1081 of the third cathode layer 108 via the second cathode layer 105. The power supply signal received by the first signal transmission layer 109 may be transmitted to the first cathode pattern 1081 via the second cathode layer 105 to supply power to the first cathode pattern 1081.

In addition, the orthographic projection of the first signal transmission layer 109 on the base substrate 101 may further partially overlap with an orthographic projection of the first cathode layer 104 on the base substrate 101, and the first signal transmission layer 109 is connected to the first cathode layer 104. Therefore, the power supply signal received by the first signal transmission layer 109 may be transmitted to the first cathode layer 104 to supply power to the first cathode layer 104.

In the embodiment of the present disclosure, the second cathode layer 105 may entirely cover the second display region 101b. Therefore, a resistance of the second cathode layer 105 may be smaller, such that a voltage difference of the power supply signal received by each first cathode pattern 1081 is smaller, thereby ensuring luminance uniformity of the second display region 101b, and further ensuring a display effect of the display panel 10.

In summary, the embodiment of the present disclosure provides a display panel. A plurality of first cathode patterns of a third cathode layer included in the display panel are spaced apart, such that the first cathode patterns will not entirely cover the second display region. In comparison with the cathode layer entirely covering the second display region, the impact on a light transmittance is effectively reduced, and the imaging effect of a camera disposed in the second display region is enhanced.

Optionally, the second cathode layer 105 in the display panel 10 may be made of a transparent conductive material. In this way, signal transmission may be performed, and a great impact on the light transmittance caused by the second cathode layer 105 may be avoided, thereby ensuring the imaging effect of the camera. Exemplarily, the second cathode layer 105 may be made of indium tin oxide (ITO).

In the embodiment of the present disclosure, the first anode layer 102, the second anode layer 106, and the first signal transmission layer 109 may be disposed in the same layer. The first light-emitting layer 103 and the second light-emitting layer 107 may be disposed in the same layer. The first cathode layer 104 and the third cathode layer 108 may be disposed in the same layer.

That is, the first anode layer 102, the second anode layer 106, and the first signal transmission layer 109 may be prepared by a same patterning process. The first light-emitting layer 103 and the second light-emitting layer 107 may be prepared by a same patterning process. The first cathode layer 104 and the third cathode layer 108 may be prepared by a same patterning process.

The signal transmitted by the first signal transmission layer 109 is different from the signals transmitted by the first anode layer 102 and the second anode layer 106. For example, the signal transmitted by the first signal transmission layer 109 may be a power supply signal, and the signals transmitted by the first anode layer 102 and the second anode layer 106 may be anode driving signals.

In the embodiment of the present disclosure, the first anode layer 102, the first light-emitting layer 103, and the first cathode layer 104 may be divided into a plurality of second sub-pixels. An orthographic projection of a light-emitting region of the second sub-pixel on the base substrate 101 may be within the orthographic projection of the first cathode layer 104 on the base substrate 101.

The first anode layer 102 may include: a plurality of anode patterns (not shown in FIG. 1). The first light-emitting layer 103 may include a plurality of light-emitting layer patterns (not shown in FIG. 1). The anode patterns one-to-one correspond to the light-emitting layer patterns. Each anode pattern, one corresponding light-emitting layer pattern, and the first cathode layer 104 may form a second sub-pixel.

In the embodiment of the present disclosure, the first sub-pixels may be categorized into a plurality of sub-pixel groups, each sub-pixel group may include a plurality of first sub-pixels, and the light-emitting regions of the first sub-pixels in at least one of the sub-pixel groups may be arranged in three rows and three columns.

The light-emitting regions of the first sub-pixels in the sub-pixel group are arranged in three rows and three columns means that the light-emitting regions of the first sub-pixels exist in at least part of nine positions in three rows and three columns. Exemplarily, the at least one of the sub-pixel groups may include: one first sub-pixel of a first color, two first sub-pixels of a second color, and one first sub-pixel of a third color. That is, the at least one of the sub-pixel groups includes four first sub-pixels, and the light-emitting region of each first sub-pixel in the four first sub-pixels may be disposed in any one of the mine positions in three rows and three columns.

Optionally, the first color may be red (R), the second color may be green (G), and the third color may be blue (B).

Figure 4:
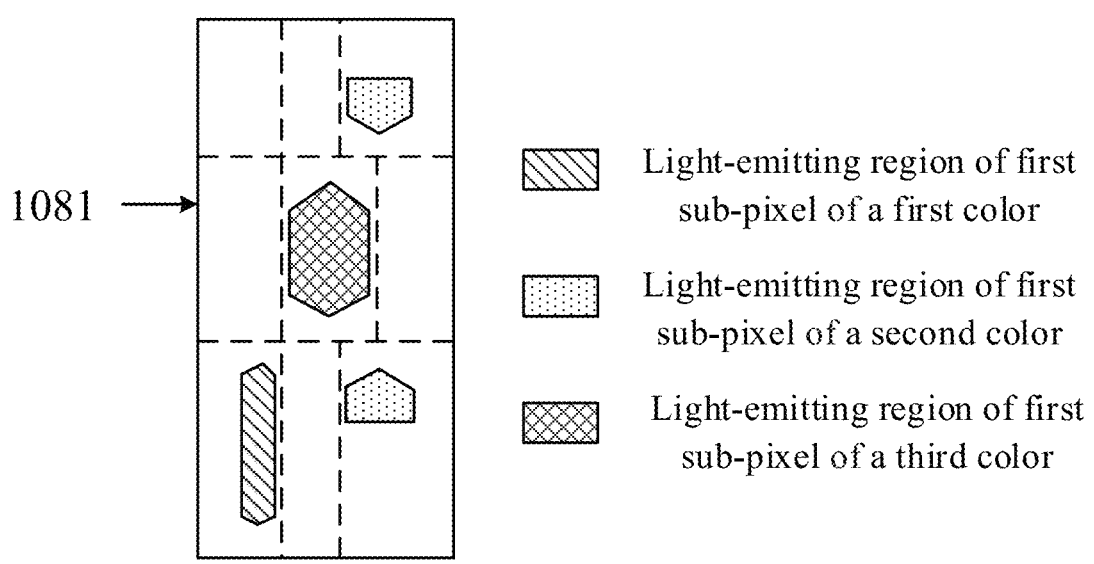
FIG. 4 is a schematic diagram of a first cathode pattern and a light-emitting region of a first sub-pixel according to an embodiment of the present disclosure.

FIG. 4 is a schematic diagram of the first cathode pattern and the light-emitting region of the first sub-pixel according to an embodiment of the present disclosure. Referring to FIG. 4, an orthographic projection of the first cathode pattern 1081 on the base substrate 101 may cover an orthographic projection of one sub-pixel group on the base substrate 101. That is, the orthographic projection of the first cathode pattern 1081 on the base substrate 101 covers an orthographic projection of the light-emitting region of the one first sub-pixel of the first color on the base substrate 101, covers orthographic projections of the light-emitting regions of the two first sub-pixels of the second color on the base substrate 101, and covers an orthographic projection of the light-emitting region of the one first sub-pixel of the third color on the base substrate 101.

Optionally, the shape of the first cathode pattern 1081 may be a first shape, and the first shape may be a centrosymmetric shape or an axisymmetric shape (the first shape being a regular shape). Exemplarily, referring to FIG. 4, the shape of the first cathode pattern 1081 may be a rectangle. Alternatively, referring to FIG. 5, the shape of the first cathode pattern 1081 may be a cross. Alternatively, referring to FIG. 6, the shape of the first cathode pattern 1081 may be an octagon.

Figure 8:
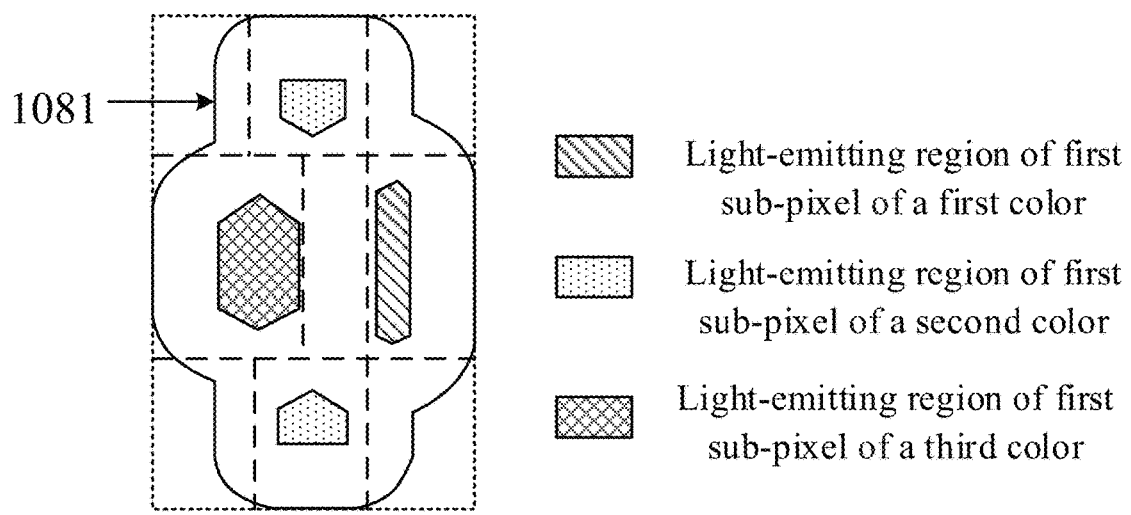
FIG. 8 is a schematic diagram of one additional first cathode pattern and light-emitting region of the first sub-pixel according to an embodiment of the present disclosure.

Alternatively, the shape of the first cathode pattern 1081 may be a second shape. Referring to FIG. 7 and FIG. 8, the second shape may be formed by connecting a plurality of straight line segments and a plurality of arc line segments end to end (the second shape being an irregular shape). The shape of the first cathode pattern 1081 is not limited in the embodiment of the present disclosure.

In addition, an extending direction of at least one of the straight line segments may be parallel to an extending direction of a boundary of the light-emitting region of at least one of the first sub-pixels in the sub-pixel group.

Referring to FIG. 4 and FIG. 7, in at least one of the sub-pixel groups, the light-emitting region of the first sub-pixel of the first color may be disposed in row 3 and column 1, the light-emitting region of one first sub-pixel of the second color is disposed in row 1 and column 3, the light-emitting region of the other second sub-pixel of the second color is disposed in row 3 and column 3, and the light-emitting region of the first sub-pixel of the third color is disposed in row 2 and column 2.

Referring to FIG. 5, FIG. 6 and FIG. 8, in at least one of the sub-pixel groups, the light-emitting region of the first sub-pixel of the first color is disposed in row 2 and column 3, the light-emitting region of one first sub-pixel of the second color is disposed in row 1 and column 2, the light-emitting region of the other first sub-pixel of the second color is disposed in row 3 and column 2, and the light-emitting region of the first sub-pixel of the third color is disposed in row 2 and column 1.

The first sub-pixels in the sub-pixel group may be arranged in other ways, which is not limited in the embodiment of the present disclosure.

In the embodiment of the present disclosure, the first cathode pattern 1081 is connected to the second cathode layer 105 via the first connecting portion. Thus, in order to avoid adverse impacts on normal light emission of the first sub-pixel in the sub-pixel group covered by the first cathode pattern 1081 due to the first connecting portion, a certain distance is required between the first connecting portion and the light-emitting region of the first sub-pixel in the sub-pixel group. Optionally, in at least one of the sub-pixel groups, the distance between the first connecting portion and the light-emitting region of at least one of the first sub-pixels in the sub-pixel group in a direction parallel to a bearing surface of the base substrate 101 may be greater than or equal to 2.5 microns. The bearing surface of the base substrate 101 may be interpreted as a plane of the base substrate 101 for disposing various film layers.

Exemplarily, in at least one of the sub-pixel groups, the distance between the first connecting portion and the light-emitting region of any first sub-pixel in the sub-pixel group in the direction parallel to the bearing surface of the base substrate 101 may be greater than or equal to 2.5 microns.

In at least one of the sub-pixel groups, the distance between the first connecting portion and the light-emitting region of any first sub-pixel in the sub-pixel group is greater than or equal to 2.5 microns may indicate: in at least one of the sub-pixel groups, a minimum distance between the first connecting portion and the light-emitting region of a first sub-pixel closest to the first connecting portion in the first sub-pixels included in the sub-pixel group may be 2.5 microns.

The distance between the first connecting portion and the light-emitting region of the first sub-pixel in the sub-pixel group should not be too large, otherwise an area of the first cathode pattern 1081 will be too large, which affects a transmittance of the display panel 10. Optionally, in at least one of the sub-pixel groups, the distance between the first connecting portion and the light-emitting region of at least one of the first sub-pixels in the sub-pixel group in the direction parallel to the bearing surface of the base substrate 101 may be less than or equal to 15 microns.

Exemplarily, in at least one of the sub-pixel groups, the distance between the first connecting portion and the light-emitting region of any first sub-pixel in the sub-pixel group in the direction parallel to the bearing surface of the base substrate 101 may be less than or equal to 15 microns.

In at least one of the sub-pixel groups, the distance between the first connecting portion and the light-emitting region of any first sub-pixel of the sub-pixel group is less than or equal to 15 microns may indicate: a maximum distance between the first connecting portion and the light-emitting region of a first sub-pixel farthest from the first connecting portion in the first sub-pixels included in the sub-pixel group may be 15 microns.

Figure 9:
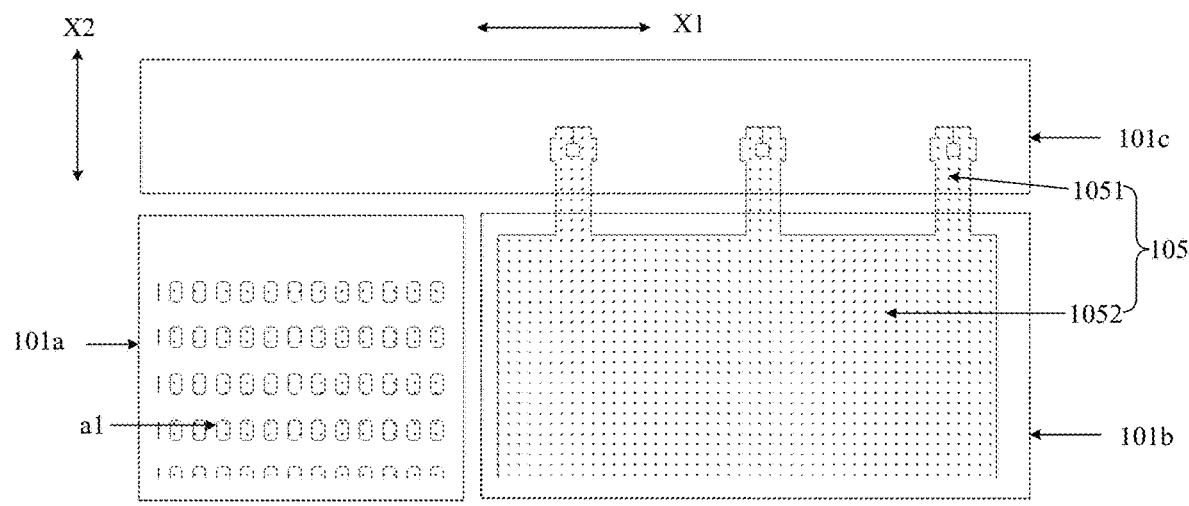
FIG. 9 is a schematic structural diagram of a second cathode layer according to an embodiment of the present disclosure.

FIG. 9 is a schematic structural diagram of a second cathode layer according to an embodiment of the present disclosure. Referring to FIG. 9, the second cathode layer 105 may include: a joint 1051. An orthographic projection of the joint 1051 on the base substrate 101 may partially overlap with the orthographic projection of the first signal transmission layer 109 on the base substrate 101, such that the second connecting portion of the first signal transmission layer 109 is connected to the joint 1051, and the power supply signal of the first signal transmission layer 109 is transmitted to the second cathode layer 105. Pattern a1 in the first display region 101*a* shown in FIG. 9 is a film layer with other functions prepared with the second cathode layer 105 by a same patterning process.

Referring to FIG. 9, the second cathode layer 105 may include a plurality of joints 1051. The joint 1051 may have a strip-shaped structure. Exemplarily, three joints 1051 are shown in FIG. 9. The joint 1051 included in the second cathode layer 105 may be a sheet-shaped structure. The shape of the joint 1051 is not limited in the embodiment of the present disclosure.

Optionally, in response to the shape of the joint 1051 being the strip-shaped structure, a length of the joint 1051 in a first direction X1 is less than a length of a main body 1052 of the second cathode layer 105 in the first direction X1. In response to the shape of the joint 1051 being the sheet-shaped structure, the length of the joint 1051 in the first direction X1 may be equal to the length of the main body 1052 of the second cathode layer 105 in the first direction X1.

In addition, a length of the joint 1051 in a second direction X2 is related to a frame width of the display panel and a distance between the second display region 101*b* and the routing region 101*c*, thus the length of the joint 1051 in the second direction X2 being not limited in the embodiment of the present disclosure. It is only necessary to ensure that the orthographic projection of the joint 1051 on the base substrate 101 is partially overlapped with the orthographic projection of the first signal transmission layer 109 on the base substrate 101.

Figure 10:
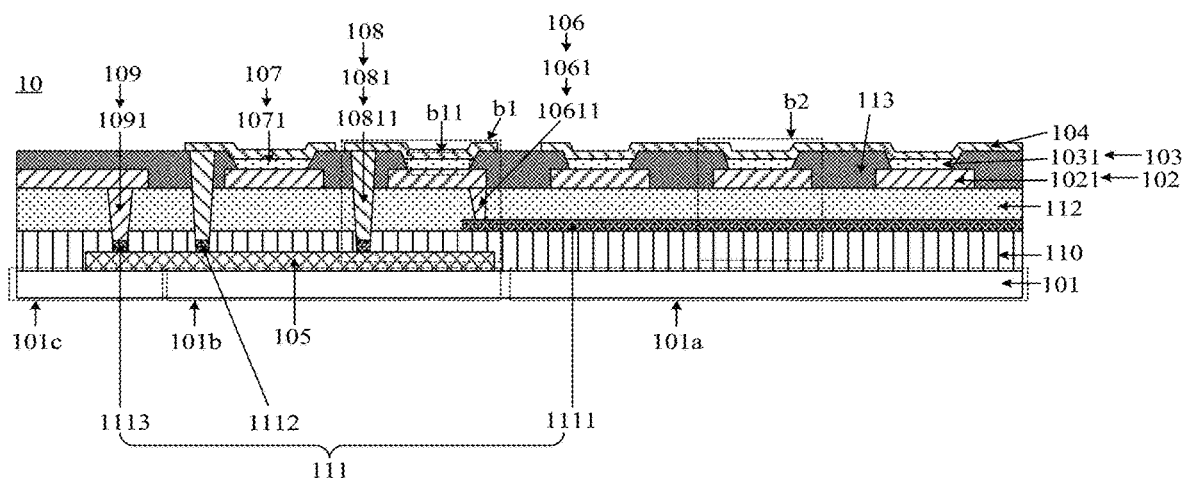
FIG. 10 is a schematic structural diagram of another display panel according to an embodiment of the present disclosure.
Figure 11:
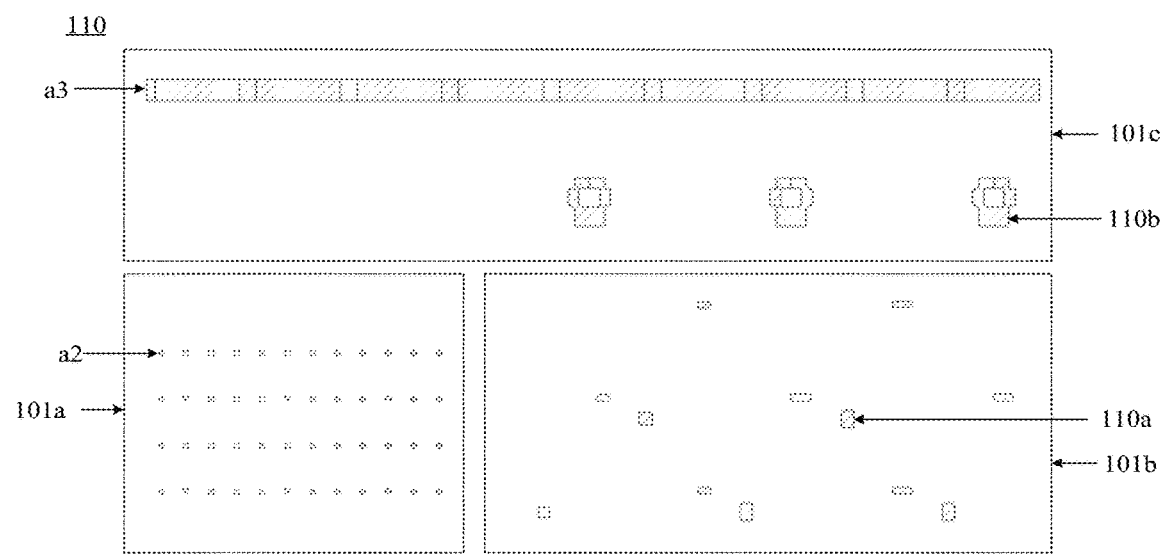
FIG. 11 is a top view of a first overcoat according to an embodiment of the present disclosure.

FIG. 10 is a schematic structural diagram of another display panel according to an embodiment of the present disclosure. Referring to FIG. 10, the display panel 10 may further include: a first overcoat 110 disposed between the second cathode layer 105 and the third cathode layer 108. FIG. 11 is a top view of the first overcoat according to an embodiment of the present disclosure. Referring to FIG. 11, the first overcoat 110 is provided with a plurality of first via holes 110*a* and a plurality of second via holes 110*b*.

In the embodiment of the present disclosure, in order to illustrate respective via holes in the first overcoat 110, the via holes are indicated by filling patterns in FIG. 11. Other regions with no filling patterns indicate the regions that the first overcoat 110 made of a solid material. In addition, via holes a2 in the first display region 101*a* and via holes a3 in the routing region 101*c* shown in FIG. 11 are via holes with other functions.

Figure 12:
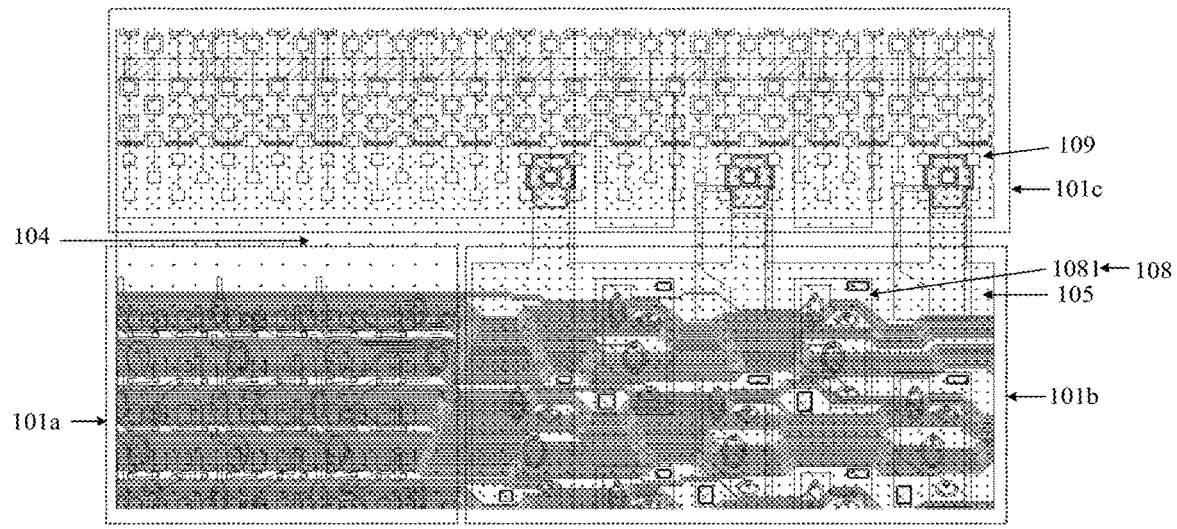
FIG. 12 is a top view of the display panel of FIG. 10.
Figure 13:
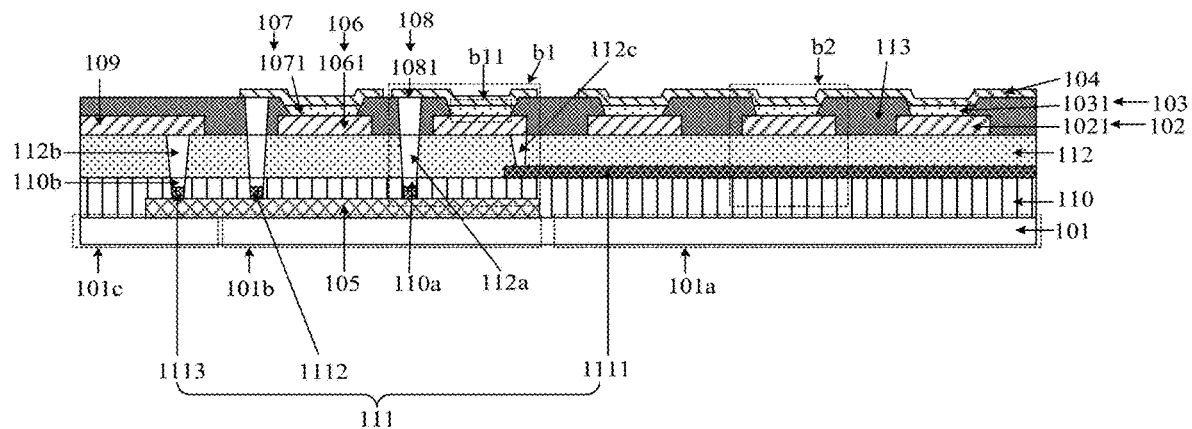
FIG. 13 is a schematic diagram of a first connecting portion and a second connecting portion that are not shown in FIG. 10.

FIG. 12 is a top view of the display panel of FIG. 10. FIG. 13 is a schematic diagram of the first connecting portion and the second connecting portion that are not shown in FIG. 10. In combination with FIG. 10, FIG. 12 and FIG. 13, an orthographic projection of the first via hole 110*a* on the base substrate 101 may be within the second display region 101*b*, and the orthographic projection of the first via hole 110*a* on the base substrate 101 is not overlapped with an orthographic projection of a light-emitting region b11 of a first sub-pixel b1 on the base substrate 101. Therefore, an effect of the arrangement of the first via hole 110*a* on the light-emitting region b11 of the first sub-pixel b1 nay be avoided, thereby ensuring that the first sub-pixel b1 can emit light normally.

Referring to FIG. 10, the first connecting portion 10811 of the first cathode pattern 1081 includes a part disposed in the first via hole 110*a*. Thus, the first cathode pattern 1081 may be connected to the second cathode layer 105 via the part of the first connecting portion 10811 disposed in the first via hole 110*a*.

In combination with FIG. 11 to FIG. 13, an orthographic projection of the second via hole 110*b* on the base substrate 101 may be within the routing region 101*c*. In addition, the orthographic projection of the second via hole 110*b* on the base substrate 101 may be within the orthographic projection of the joint 1051 on the base substrate 101. The second connecting portion 1091 of the first signal transmission layer 109 may have a part disposed in the second via hole 110*b*. Thus, the first signal transmission layer 109 can be connected to the joint 1051 via the part of the second connecting portion 1091 disposed in the second via hole 110*b*.

In the embodiment of the present disclosure, referring to FIG. 10 and FIG. 13, the display panel 10 may further include: a plurality of pixel circuits (not shown in the drawing) disposed in the first display region 101*a*, and a second signal transmission layer lll disposed between the first overcoat 110 and the third cathode layer 108. The pixel circuit may be electrically connected to the second anode layer 106 by the second signal transmission layer 111, such that the pixel circuit can provide a driving signal to the second anode layer 106.

Moreover, because of the pixel circuits being disposed in the first display region 101*a*, the pixel circuits will not affect a transmittance of the second display region 101b), and the imaging effect of a camera can be ensured.

Figure 14:
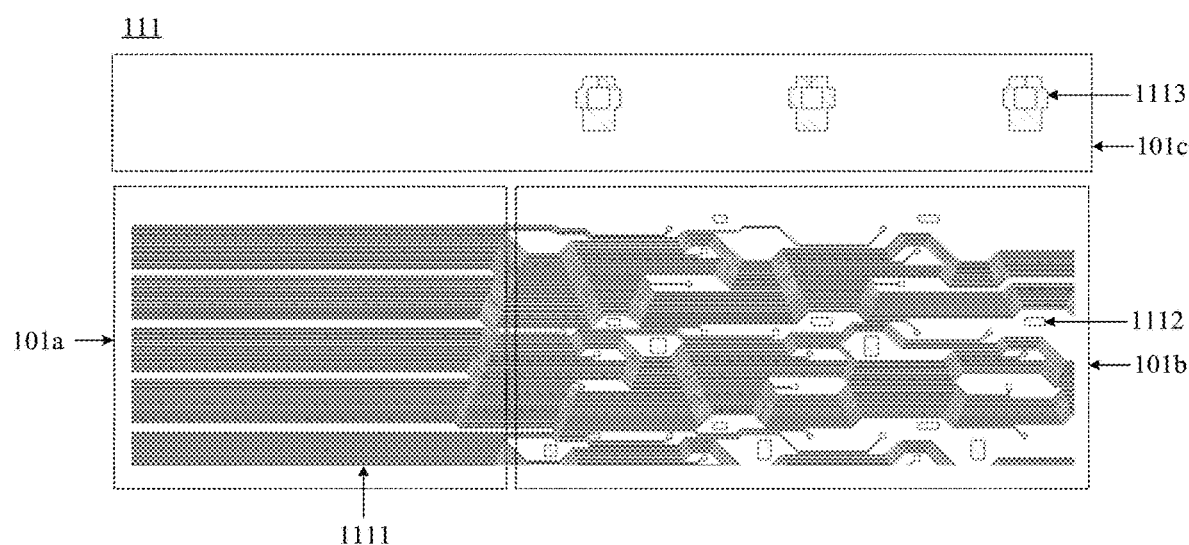
FIG. 14 is a top view of a second signal transmission layer according to an embodiment of the present disclosure.
Figure 15:
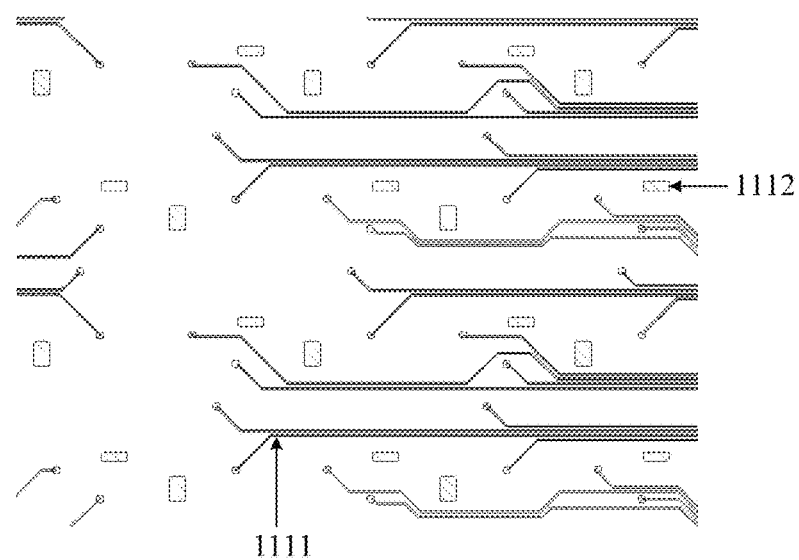
FIG. 15 is a schematic diagram of a portion of the second signal transmission layer of FIG. 14.

FIG. 14 is a top view of a second signal transmission layer according to an embodiment of the present disclosure. FIG. 15 is a schematic diagram of a portion of the second signal transmission layer of FIG. 14. Referring to FIG. 10 and FIG. 13 to FIG. 15, the second signal transmission layer 111 may include a plurality of transmission traces 1111. One end of the transmission trace 1111 may be connected to the second anode layer 106, and the other end of the transmission trace 1111 may be connected to the pixel circuit. That is, the pixel circuit may be connected to the second anode layer 106 via the transmission trace 1111 to provide a driving signal to the second anode layer 106.

Optionally, the pixel circuits may include: a plurality of first-type pixel circuits and a plurality of second-type pixel circuits. The first-type pixel circuit may be connected to the anode pattern 1061 of the second anode layer 106 via the transmission trace 1111. The second-type pixel circuit may be connected to the anode pattern 1021 of the first anode layer 102. That is, the first-type pixel circuit may be configured to drive the first sub-pixel b1 disposed in the second display region 101b to emit light, and the second-type pixel circuit may be configured to drive a second sub-pixel b2 in the first display region 101a to emit light.

Referring to FIG. 14, the second signal transmission layer 111 may further include: a plurality of first transmission patterns 1112 disposed in the second display region 101b. Referring to FIG. 10, the first transmission pattern 1112 may be disposed in the first via hole 110a and configured to connect the second cathode layer 105 and the first connecting portion 10811.

Because the second cathode layer 105 will be exposed by the first via hole 110a, the first transmission pattern 1112 disposed in the first via hole 110a of the first overcoat 110 may protect the second cathode layer 105, thereby ensuring a quality of the second cathode layer 105. Therefore, the reliability that the first signal transmission layer 109 transmits the power supply signal to the first cathode pattern 1081 by the second cathode layer 105 may be ensured.

In the embodiment of the present disclosure, a thickness of the first transmission pattern 1112 is generally less than a thickness of the first overcoat 110, such that part of the first connecting portion 10811 may extend into the first via hole 110a. The first connecting portion 10811 may be electrically connected to the second cathode layer 105 via the first transmission pattern 1112. In response to the second signal transmission layer 111 not including the first transmission pattern 1112 disposed in the first via hole 110a, the part of the first connecting portion 10811 may be disposed in the first via hole 110a and directly electrically connected to the second cathode layer 105. Therefore, in the above two cases, the first connecting portion 10811 includes a part disposed in the first via hole 110a.

Referring to FIG. 10, FIG. 13 and FIG. 14, the second signal transmission layer 111 may further include: a plurality of second transmission patterns 1113 disposed in the routing region 101c. The second transmission pattern 1113 may be disposed in the second via hole 110b and configured to electrically connect the second cathode layer 105 and the second connecting portion 1091.

Because the first signal transmission layer 109 will be exposed by the second via hole 110b, the second transmission pattern 1113 disposed in the second via hole 110b of the first overcoat 110 may protect the first signal transmission layer 109, thereby ensuring a quality of the first signal transmission layer 109. In this way, the reliability that the first signal transmission layer 109 transmits the power supply signal to the second cathode layer 105 may be ensured.

In the embodiment of the present disclosure, a thickness of the second transmission pattern 1113 is generally less than the thickness of the first overcoat 110, such that part of the second connecting portion 1091 may extend into the second via hole 110b. The second connecting portion 1091 may be electrically connected to the first signal transmission layer 109 via the second transmission pattern 1113. In response to the second signal transmission layer 111 not including the second transmission pattern 1113 disposed in the second via hole 110b, the part of the second connecting portion 1091 may be disposed in the second via hole 110b. The second connecting portion 1091 may be directly connected to the second cathode layer 105. Therefore, in the above two cases, the second connecting portion 1091 includes a part disposed in the second via hole 110b.

Optionally, the second signal transmission layer 111 in the display panel 10 according to the embodiment of the present disclosure may be made of a transparent conductive material. That is, the transmission trace 1111, the first transmission pattern 1112, and the second transmission pattern 1113 in the second signal transmission layer 111 are all made of the transparent conductive material. Therefore, on the premise of performing signal transmission, a great impact on the light transmittance caused by the second signal transmission layer 111 may be avoided, thereby ensuring the imaging effect of the camera.

Exemplarily, the transmission trace 1111, the first transmission pattern 1112, and the second transmission pattern 1113 in the second signal transmission layer 111 may all be made of the ITO.

Figure 16:
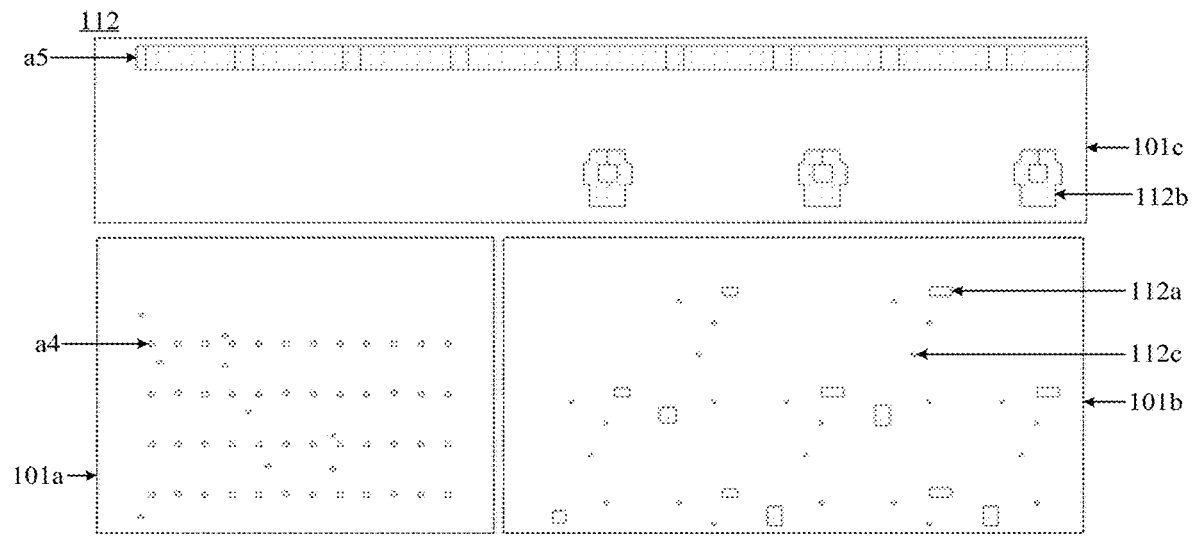
FIG. 16 is a top view of a second overcoat according to an embodiment of the present disclosure.

Referring to FIG. 10 and FIG. 13, the display panel 10 may further include: a second overcoat 112 disposed between the second signal transmission layer 111 and the third cathode layer 108. FIG. 16 is a top view of the second overcoat according to an embodiment of the present disclosure. Referring to FIG. 16, the second overcoat 112 may have a plurality of third via holes 112a and a plurality of fourth via holes 112b.

In the embodiment of the present disclosure, a first overlapping region may be between an orthographic projection of the third via hole 112a on the base substrate 101 and the orthographic projection of the first via hole 110a on the base substrate 101. A ratio of an area of the first overlapping region to an area of the orthographic projection of the first via hole 110a on the base substrate 101 may be greater than or equal to 80%. In combination with FIG. 10 and FIG. 13, the first connecting portion 10811 may have a part disposed in the third via hole 112a, and the first connecting portion 10811 may be configured to electrically connect the second signal transmission layer 111 and the third cathode layer 108.

The second overcoat 112 is disposed between the second signal transmission layer 111 and the third cathode layer 108, such that in response to the second overcoat 112 being formed, the second overcoat 112 may cover the first via hole 110a. Therefore, by disposing the third via holes 112a in the second overcoat 112, the first overlapping region being between the orthographic projection of the third via hole 112a on the base substrate 101 and the orthographic projection of the first via hole 110a on the base substrate 101, the first connecting portion 10811 may be disposed in the third via hole 112a for electrical connection between the first transmission pattern 1112 and the first cathode pattern 1081.

Furthermore, a second overlapping region may be between an orthographic projection of the fourth via hole 112b on die base substrate 101 and the orthographic projection of the second via hole 110b on the base substrate 101. A ratio of an area of the second overlapping region to an area of the orthographic projection of the second via hole 110b on the base substrate 101 is greater than or equal to 80%. In combination with FIG. 10 and FIG. 13, the second connecting portion 1091 may have a part disposed in the fourth via hole 112b, and the second connecting portion 1091 may be configured to electrically connect the first signal transmission layer 109 and the second signal transmission layer 111.

The second overcoat 112 is disposed between the second signal transmission layer 111 and the third cathode layer 108, such as being disposed between the second signal transmission layer 111 and the first signal transmission layer 109. Therefore, in response to the second overcoat 112 being formed, the second overcoat 112 may cover the second via hole 110b. Therefore, by disposing the fourth via holes 1121) in the second overcoat 112, the second overlapping region being between the orthographic projection of the fourth via hole 112b on the base substrate 101 and the orthographic projection of the second via hole 110b on the base substrate 101, the second connecting portion 1091 may be disposed in the fourth via hole 112b for electrical connection between the second transmission pattern 1113 and the first signal transmission layer 109.

In the embodiment of the present disclosure, referring to FIG. 16, the second overcoat 112 may further have a plurality of fifth via holes 112c. The anode pattern 1061 of the second anode layer 106 may include: a third connecting portion 10611 disposed in the fifth via hole 112c, and the second anode layer 106 may be electrically connected to the transmission trace 1111 in the second signal transmission layer 111 via the third connecting portion 10611.

Because of the second signal transmission layer 111 and the second anode layer 106 being respectively disposed on two sides of the second overcoat 112, in order to electrically connect the second signal transmission layer 111 and the second anode layer 106, the fifth via holes 112c are disposed in the second overcoat 112. The third connecting portion 10611 disposed in the fifth via hole 112e may be configured to electrically connect one transmission trace 1111 in the second signal transmission layer Ill and one anode pattern 1061 of the second anode layer 106.

In the embodiment of the present disclosure, in order to illustrate respective via holes in the second overcoat 112, the via holes are indicated by filling patterns in FIG. 16. Other regions with no filling patterns indicate the regions that the second overcoat 112 made of a solid material. In addition, via holes a4 in the first display region 101a and via holes a5 in the routing region 101c shown in FIG. 16 are via holes with other functions.

Figure 17:
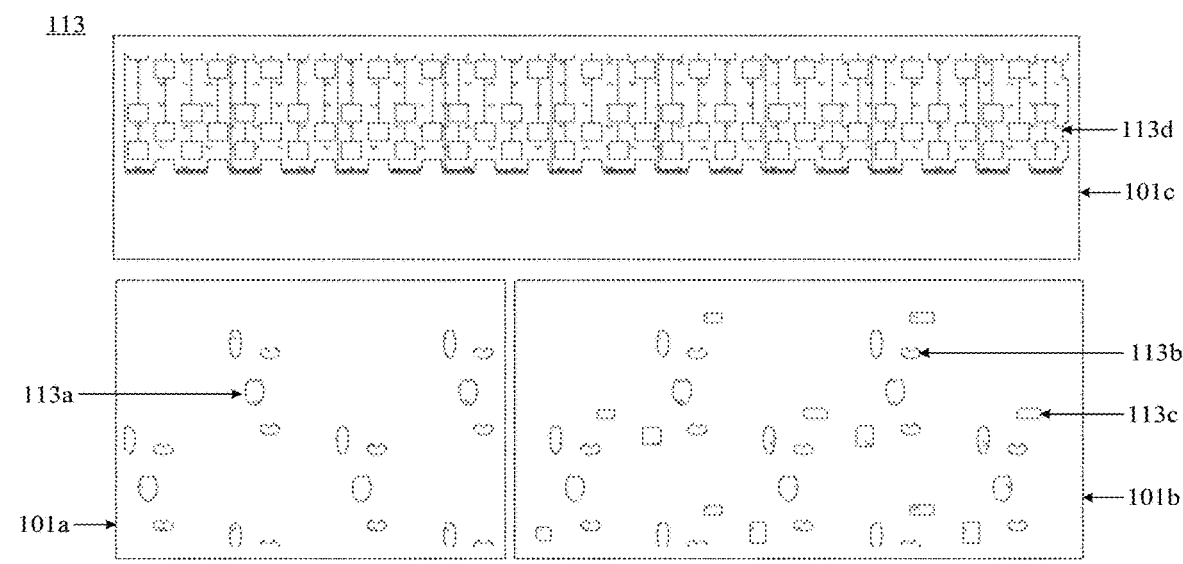
FIG. 17 is a top view of a pixel define layer according to an embodiment of the present disclosure.

Referring to FIG. 10 and FIG. 13, the display panel 10 may further include: a pixel define layer 113. FIG. 17 is a top view of the pixel define layer according to an embodiment of the present disclosure. Referring to FIG. 17, the pixel define layer 113 may have a plurality of sixth via holes 113a and a plurality of seventh via holes 113b.

In the embodiment of the present disclosure, an orthographic projection of the sixth via hole 113a on the base substrate 101 may be covered by an orthographic projection of the first light-emitting layer 103 on the base substrate 101, and the first light-emitting layer 103 may be in contact with the first anode layer 102 via the sixth via hole 113a.

The pixel define layer 113 may be disposed on a side, distal from the base substrate 101, of the first anode layer 102. The first anode layer 102 includes a plurality of anode patterns 1021. Each sixth via hole 113a in the pixel define layer 113 may be configured to expose part of one anode pattern 1021 of the first anode layer 102. In addition, the light-emitting layer pattern 1031 of the first light-emitting layer 103 may be disposed in the sixth via hole 113a. Therefore, the light-emitting layer pattern 1031 of the first light-emitting layer 103 contacts with the anode pattern 1021 of the first anode layer 102, thereby ensuring that the second sub-pixel b2 disposed in the first display region 101a can normally emit light.

In addition, an orthographic projection of the seventh via hole 113b on the base substrate 101 may be covered by an orthographic projection of the second light-emitting layer 107 on the base substrate 101, and the second light-emitting layer 107 may be in contact with the second anode layer 106 via the seventh via hole 113b.

The pixel define layer 113 may be disposed on a side, distal from the base substrate 101, of the second anode layer 106. The second anode layer 106 includes a plurality of anode patterns 1061. Each seventh via hole 113b in the pixel define layer 113 may expose part of one anode pattern 1061 of the second anode layer 106. In addition, the light-emitting layer pattern 1071 of the second light-emitting layer 107 may be disposed in the seventh via hole 113b, to enable contact between the light-emitting layer pattern 1071 of the second light-emitting layer 107 and the anode pattern 1061 of the second anode layer 106, thereby ensuring that the first sub-pixel b1 disposed in the second display region 101b can normally emit light.

Referring to FIG. 17, the pixel define layer 113 may further have a plurality of eighth via holes 113c. A third overlapping region may be between an orthographic projection of the eighth via hole 113c on the base substrate 101 and the orthographic projection of the first via hole 110a on the base substrate 101. A ratio of an area of the third overlapping region to the area of the orthographic projection of the first via hole 110a on the base substrate 101 may be greater than or equal to 80%.

The pixel define layer 113 is disposed between the first overcoat 110 and the third cathode layer 108, such that in response to the pixel define layer 113 being formed, the pixel define layer 113 will cover the first via hole 110a in the first overcoat 110. Thus, by disposing the eighth via holes 113c in the pixel define layer 113, the third overlapping region being between the orthographic projection of the eighth via hole 113c on the base substrate 101 and the orthographic projection of the first via hole 110a on the base substrate 101, the first connecting portion 10811 of the first cathode pattern 1081 of the third cathode layer 108 may be disposed in the eighth via hole 113c and the first via hole 110a for electrical connection between the second cathode layer 105 and the third cathode layer 108.

Referring to FIG. 17, the pixel define layer 113 may further have a plurality of ninth via holes 113d. An orthographic projection of the ninth via hole 113d on the base substrate 101 may be within the orthographic projection of the first signal transmission layer 109 on the base substrate 101. The first cathode layer 104 may be electrically connected to the first signal transmission layer 109 via the ninth via hole 113d.

In the embodiment of the present disclosure, referring to FIG. 17, the ninth via holes 113d may connect with each other. That is, the ninth via holes 113d are not a plurality of isolated through holes.

The pixel define layer 113 is disposed between the first signal transmission layer 109 and the first cathode layer 104, such that in response to the pixel define layer 113 being formed, the pixel define layer 113 will cover the first signal transmission layer 109. That is, the power supply signal received by the first signal transmission layer 109 may not be transmitted to the first cathode layer 104. Thus, by disposing the ninth via holes 113d in the pixel define layer 113, the orthographic projection of the ninth via hole 113d on the base substrate 101 being within the orthographic projection of the first signal transmission layer 109 on the base substrate 101, the first cathode layer 104 and the first signal transmission layer 109 can be connected via the ninth via hole 113d, thus enabling signal transmission.

In the embodiment of the present disclosure, in order to illustrate respective via holes in the pixel define layer 113, the via holes are indicated by filling patterns in FIG. 17. Other regions with no filling patterns indicate the regions that the pixel define layer 113 made of a solid material.

Figure 18:
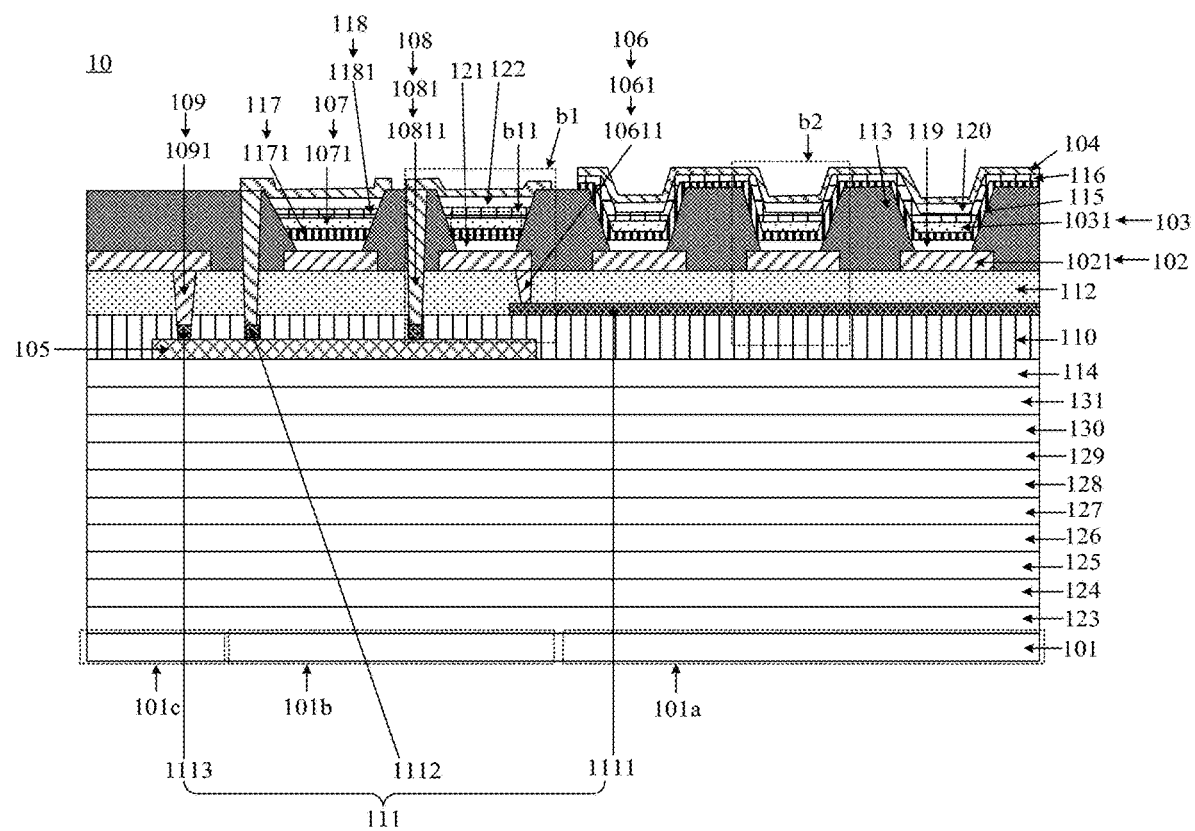
FIG. 18 is a schematic structural diagram of yet another display panel according to an embodiment of the present disclosure.

FIG. 18 is a schematic structural diagram of yet another display panel according to an embodiment of the present disclosure. Referring to FIG. 18, the display panel 10 may further include: a third overcoat 114 disposed on a side, proximal to the base substrate 101, of the second cathode layer 105.

Figure 19:
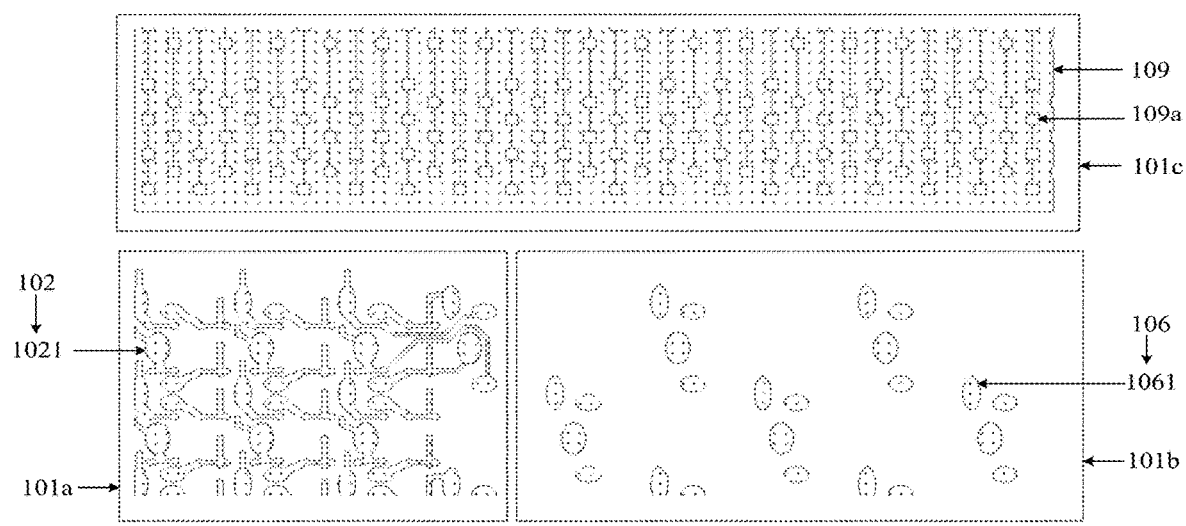
FIG. 19 is a top view of a first anode layer, a second anode layer, and a first signal transmission layer according to an embodiment of the present disclosure.

FIG. 19 is a top view of the first anode layer, the second anode layer, and the first signal transmission layer according to an embodiment of the present disclosure. Referring to FIG. 19, the first signal transmission layer 109 may have a tenth via hole 109a (not shown in FIG. 18), and the tenth via hole 109a of the first signal transmission layer 109 may expose the third overcoat 114. In addition, the tenth via hole 109a may be filled with the pixel define layer 113 on a side, distal from the base substrate 101, of the first signal transmission layer 109.

Optionally, in combination with FIG. 9, FIG. 12, and FIG. 19, in the tenth via holes 109a, there is at least one of the tenth via holes 109a of which an orthographic projection on the base substrate 101 is within the orthographic projection of the joint 1051 of the second cathode layer 105 on the base substrate 101. In addition, an area of the orthographic projection of the tenth via hole 109a on the base substrate 101 is smaller than an area of the orthographic projection of the joint 1051 of the second cathode layer 105 on the base substrate 101.

Exemplarily, the second cathode layer 105 in FIG. 9 and FIG. 12 includes three joints 1051. The orthographic projection of each joint 1051 on the base substrate 101 may cover the orthographic projection of one tenth via hole 109a on the base substrate 101.

Besides, a boundary of the tenth via hole 109a may not overlap with a boundary of the joint 1051. Thus, an orthographic projection of the second connecting portion 1091 on the base substrate 101 may surround the orthographic projection of the tenth via hole 109a on the base substrate 101. That is, the orthographic projection of the second connecting portion 1091 on the base substrate 101 may be a ring-shaped structure.

Figure 20:
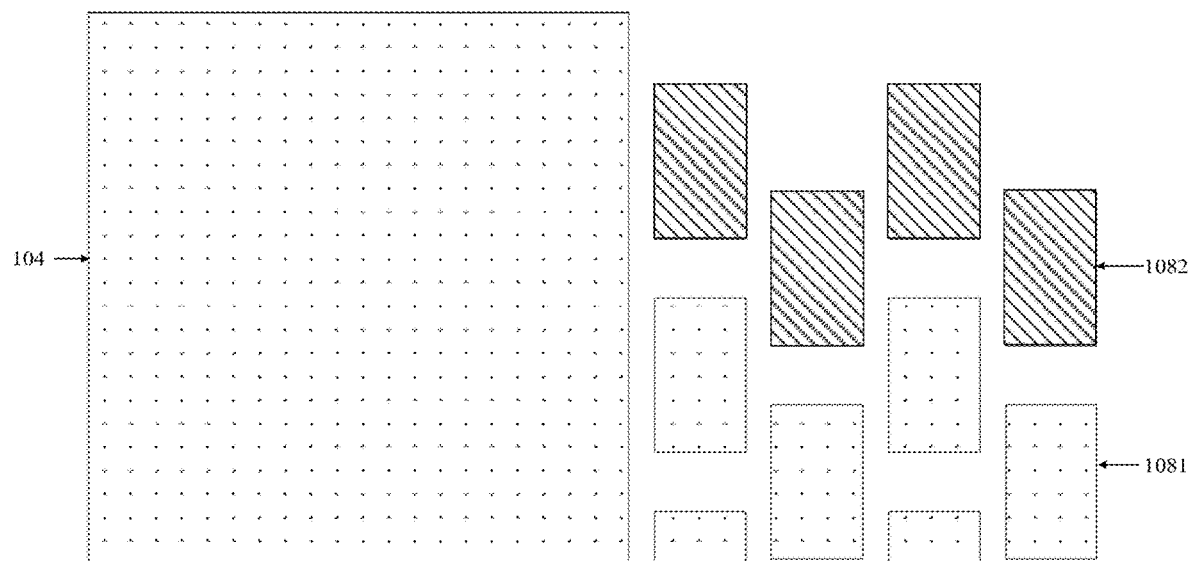
FIG. 20 is a top view of a first cathode layer and a third cathode layer according to an embodiment of the present disclosure.

Referring to FIG. 20, the third cathode layer 108 in the display panel 10 according to the embodiment of the present disclosure may further include: a plurality of second cathode patterns 1082 spaced apart. An orthographic projection of the second cathode patterns 1082 on the base substrate 101 may not overlap with the orthographic projection of the light-emitting region of the first sub-pixel b1 on the base substrate 101. For example, the second cathode pattern 1082 is closer to the routing region 101c than the first cathode pattern 1081.

Due to the orthographic projection of the second cathode pattern 1082 on the base substrate 101 being not overlapped with the orthographic projection of the light-emitting region of the first sub-pixel b1 on the base substrate 101, the region that the second cathode pattern 1082 being disposed cannot emit light normally. An orthographic projection of a first-type second cathode pattern in the second cathode patterns 1082 on the base substrate 101 may be completely within the orthographic projection of the first signal transmission layer 109 on the base substrate 101. An orthographic projection of a second-type second cathode pattern on the base substrate 101 is only partially within the orthographic projection of the first signal transmission layer 109 on the base substrate 101. The first-type second cathode pattern is closer to the routing region 101c than the second-type second cathode pattern.

In the embodiment of the present disclosure, an orthographic projection of the part of the second-type second cathode pattern that is not overlapped with the first signal transmission layer 109 on the base substrate 101 may cover the orthographic projection of the joint 1051 of the second cathode layer 105 on the base substrate 101. In this way, a transmittance of the region of the display panel 10 other than the regions where the second-type second cathode pattern and the joint 1051 are disposed is high, and the imaging effect of a camera is ensured.

The orthographic projection of the part of the second-type second cathode pattern that is not overlapped with the first signal transmission layer 109 on the base substrate 101 may not overlap with the orthographic projection of the joint 1051 of the second cathode layer 105 on the base substrate 101. That is, the second-type second cathode pattern and the joint 1051 may be disposed in different regions. In this way, the impact on transmittance uniformity of respective regions of the display panel 10 due to part of the display panel 10 having a low transmittance and another part having a high transmittance may be avoided.

In the embodiment of the present disclosure, referring to FIG. 18, the display panel 10 may further include: a first hole transport layer 115 and a first electron transport layer 116 disposed in the first display region 101a, and a second hole transport layer 117 and a second electron transport layer 118 disposed in the second display region 101b.

Figure 21:
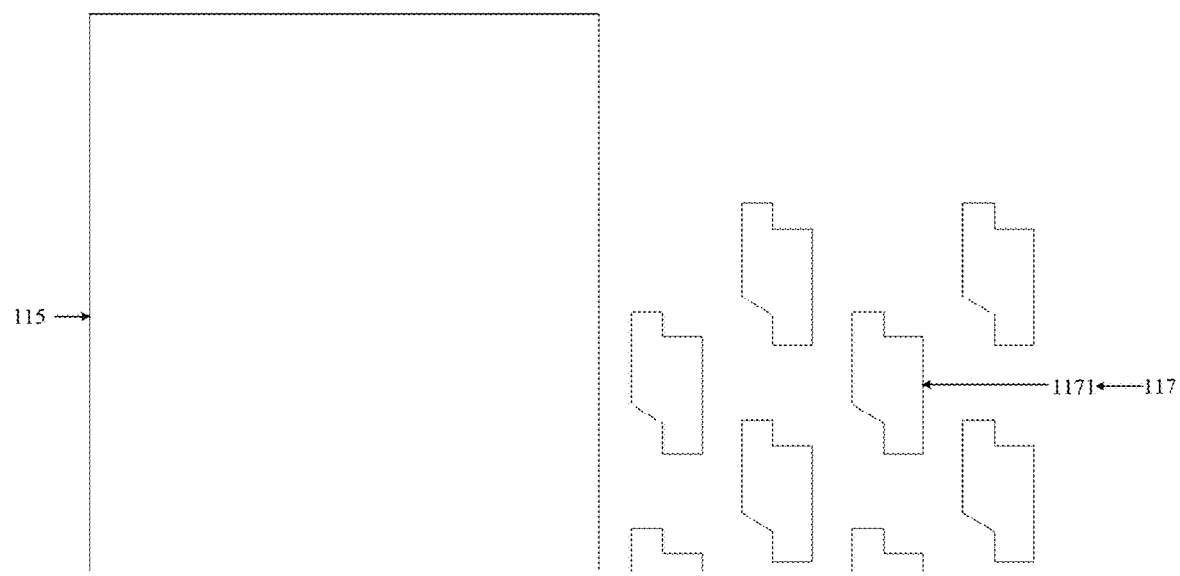
FIG. 21 is a top view of a first hole transport layer and a second hole transport layer according to an embodiment of the present disclosure.

FIG. 21 is a top view of the first hole transport layer and the second hole transport layer according to an embodiment of the present disclosure. Referring to FIG. 21, the first hole transport layer 115 may have a plate structure. The second hole transport layer 117 may include a plurality of hole transport patterns 1171 spaced apart.

In the embodiment of the present disclosure, a shape and size of the first electron transport layer 116 may be the same as the shape and size of the first hole transport layer 115. For example, the shape of the first electron transport layer 116 may refer to the shape of the first hole transport layer 115 in FIG. 21. The first electron transport layer 116 may have a plate structure. In addition, a shape and size of the second electron transport layer 118 may be the same as the shape and size of the second hole transport layer 117. For example, the shape of the second electron transport layer 118 may refer to the shape of the second hole transport layer 117 in FIG. 21. The second electron transport layer 118 may include a plurality of electron transport patterns 1181 spaced apart.

In the embodiment of the present disclosure, an area of the hole transport pattern 1171 and an area of the electron transport pattern 1181 are both smaller than an area of the first cathode pattern 1081.

The second hole transport layer 117 and the second electron transport layer 118 are both disposed between the second cathode layer 105 and the third cathode layer 108 (the second cathode layer 105 being disposed on a side, proximal to the base substrate 101, of the second hole transport layer 117 and the second electron transport layer 118, and the third cathode layer 108 being disposed on a side, distal from the base substrate 101, of the second hole transport layer 117 and the second electron transport layer 118), and the second hole transport layer 117 and the second electron transport layer 118 are generally poor in conductivity.

Because of the area of the hole transport pattern 1171 and the area of the electron transport pattern 1181 being both smaller than the area of the first cathode pattern 1081, the first cathode pattern 1081 of the third cathode layer 108 includes a target part that is not overlapped with the hole transport pattern 1171 and the electron transport pattern 1181. Thus, the target part of the first cathode pattern 1081 may be connected to the second cathode layer 105 on a side, proximal to the base substrate 101, of the hole transport pattern 1171 and the electron transport pattern 1181.

Referring to FIG. 20, an orthographic projection of the hole transport pattern 1171 on the base substrate 101 may cover the orthographic projection of the light-emitting region b11 of the first sub-pixel b1 on the base substrate 101, and an orthographic projection of the electron transport pattern 1181 on the base substrate 101 may cover the orthographic projection of the light-emitting region b11 of the first sub-pixel b1 on the base substrate 101. In addition, because of the first cathode pattern 1081 being connected to the second cathode layer 105 via the first connecting portion 10811, the orthographic projection of the hole transport pattern 1171 on the base substrate 101 and the orthographic projection of the electron transport pattern 1181 on the base substrate 101 are required to not overlap with the orthographic projection of the first connecting portion 10811 on the base substrate 101.

In the embodiment of the present disclosure, in addition to the anode pattern 1061, the light-emitting layer pattern 1071, and the first cathode pattern 1081, the first sub-pixel may further include: at least part of the hole transport pattern 1171 and at least part of the electron transport pattern 1181, Optionally, four first sub-pixels may share one hole transport pattern 1171 and one electron transport pattern 1181.

In addition, the anode pattern of the first anode layer 102, one light-emitting layer pattern corresponding to the first light-emitting layer 103, the first cathode layer 104, the first hole transport layer 115, and the first electron transport layer 116 may form one second sub-pixel. That is, a plurality of second sub-pixels disposed in the first display region 101a may share the first cathode layer 104, the first hole transport layer 115, and the first electron transport layer 116.

Referring to FIG. 18, the display panel 10 may further include: a first hole injection layer 119 and a first electron injection layer 120 disposed in the first display region 101a, and a second hole injection layer 120 and a second electron injection layer 122 disposed in the second display region 101b.

Each of the first hole injection layer 119 and the second hole injection layer 121 may include a plurality of hole injection patterns spaced apart. In addition, the first hole injection layer 119 and the second hole injection layer 121 may be prepared by using a fine metal mask (FMM). Each of the first electron injection layer 120 and the second electron injection layer 122 may include a plurality of electron injection patterns spaced apart. In addition, the first electron injection layer 120 and the second electron injection layer 122 may be prepared by using the FMM.

In the embodiment of the present disclosure, the first sub-pixel may further include: a hole injection pattern of the second hole injection layer 121, and an electron injection pattern of the second electron injection layer 122. The second sub-pixel may further include: a hole injection pattern of the first hole injection layer 119 and an electron injection pattern of the first electron injection layer 120.

Optionally, four first sub-pixels may share one hole injection pattern of the second hole injection layer 121 and one electron injection pattern of the second electron injection layer 122. Four second sub-pixels may share one hole injection pattern of the first hole injection layer 119 and one electron injection pattern of the first electron injection layer 120.

Referring to FIG. 18, the display panel 10 may further include: a barrier layer 123, a buffer layer 124, a poly layer 125, a first gate insulator (GI) layer 126, a first gate (G) layer 127, a second GI layer 128, a second G layer 129, an inter-layer dielectric (ILD) layer 130, and a source-drain electrode layer 131. The source-drain electrode layer 131 may include a source (S) electrode and a drain (D) electrode.

In summary, the embodiment of the present disclosure provides the display panel. A plurality of first cathode patterns of a third cathode layer included in the display panel are spaced apart, such that the first cathode patterns will not entirely cover a second display region. In comparison with the cathode layer entirely covering the second display region, the impact on a light transmittance is effectively reduced, and the imaging effect of a camera disposed in the second display region is enhanced.

Figure 22:
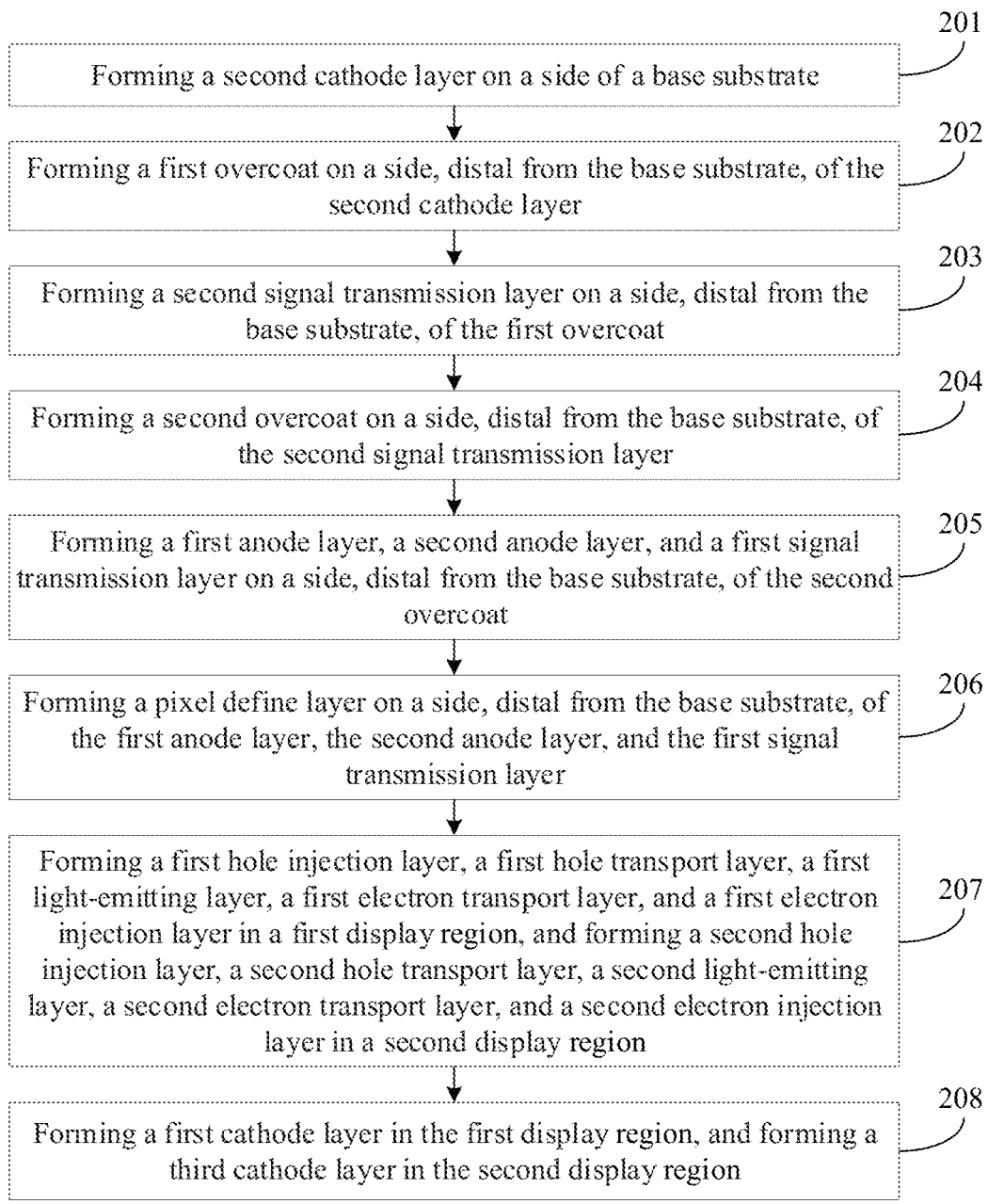
FIG. 22 is a flowchart of a method for manufacturing a display panel according to an embodiment of the present disclosure.

FIG. 22 is a flowchart of a method for manufacturing a display panel according to an embodiment of the present disclosure. This method is for manufacturing the display panel according to the foregoing embodiment. Referring to FIG. 22, the method may include the following processes.

In 201, a second cathode layer is formed on a side of a base substrate.

In the embodiment of the present disclosure, when the display panel 10 is prepared, referring to FIG. 9, the second cathode layer 105 may be formed on a side of the base substrate 101 at first. The base substrate 101 may be a flexible substrate. For example, the base substrate 101 may be made of polyimide (PI). The second cathode layer 105 may be made of a transparent conductive material, such as ITO.

In 202, a first overcoat is formed on a side, distal from the base substrate, of the second cathode layer.

Figure 23:
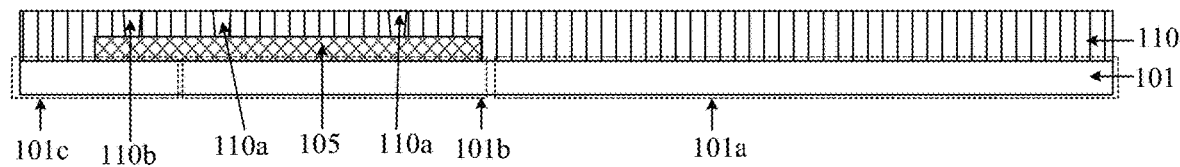
FIG. 23 is a cross-sectional view of a second cathode layer and a formed first overcoat according to an embodiment of the present disclosure.
Figure 24:
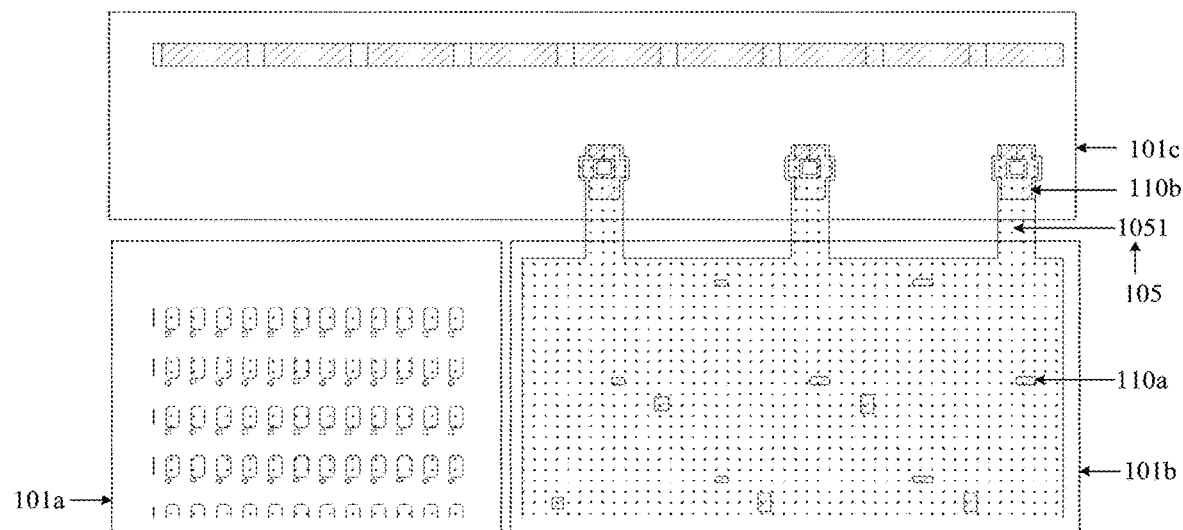
FIG. 24 is a top view of the second cathode layer and the formed first overcoat according to an embodiment of the present disclosure.

In the embodiment of the present disclosure, referring to FIG. 23 and FIG. 24, the first overcoat 110 may be formed on a side, distal from the base substrate 101, of the second cathode layer 105. The first overcoat 110 may have a plurality of first via holes 110a and a plurality of second via holes 110b.

In 203, a second signal transmission layer is formed on a side, distal from the base substrate, of the first overcoat.

Figure 25:
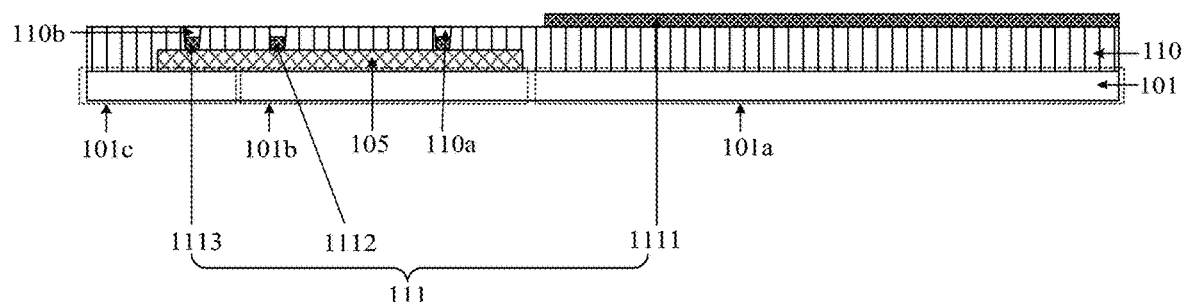
FIG. 25 is a cross-sectional view of a formed second signal transmission layer.
Figure 26:
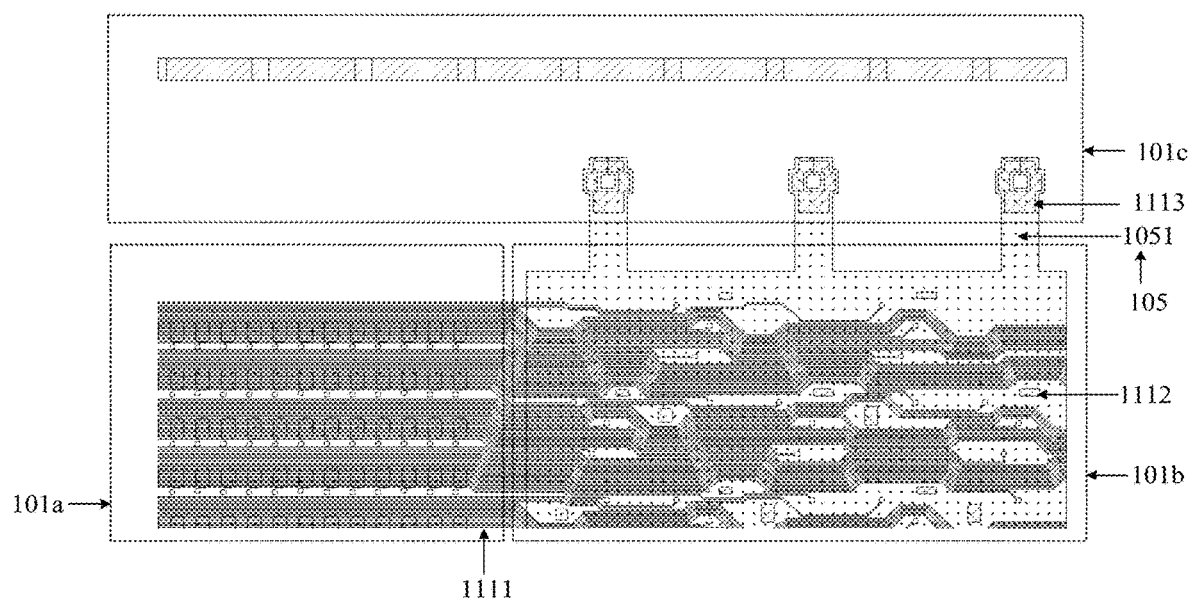
FIG. 26 is a top view of the formed second signal transmission layer.
Figure 27:
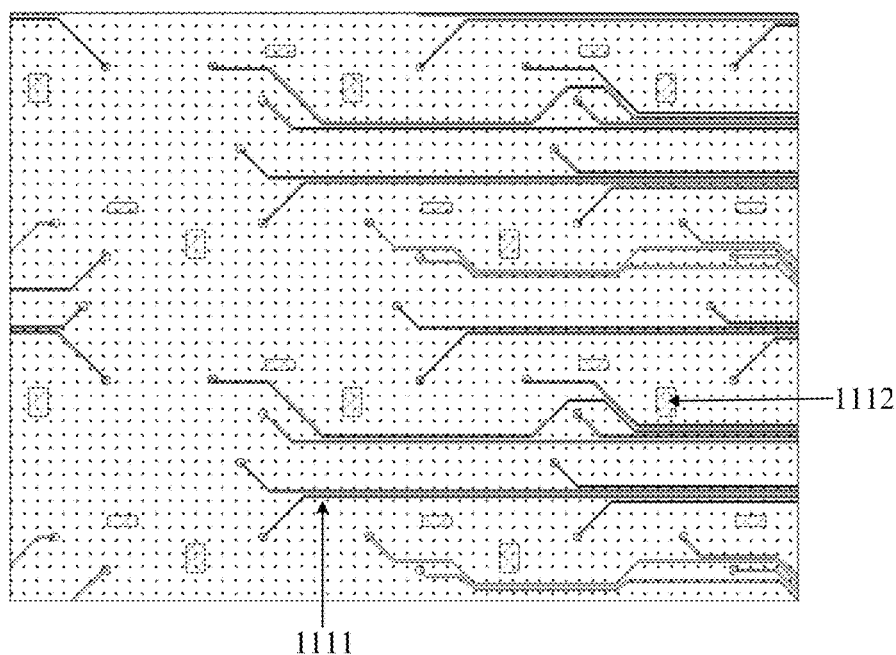
FIG. 27 is a schematic diagram of a portion of FIG. 26.

In the embodiment of the present disclosure, referring to FIG. 25 to FIG. 27, the second signal transmission layer III may be formed on a side, distal from the base substrate 101, of the first overcoat 110. The second signal transmission layer Ill includes: a transmission trace 1111, a first transmission pattern 1112, and a second transmission pattern 1113. The transmission trace 1111 is configured to connect a pixel circuit and an anode pattern 1061 of a second anode layer 106 disposed in a second display region 101b. The first transmission pattern 1112 may be disposed in the first via hole 110*a*, and the second transmission pattern 1113 may be disposed in the second via hole 110*b*.

In 204, a second overcoat is formed on a side, distal from the base substrate, of the second signal transmission layer.

Figure 28:
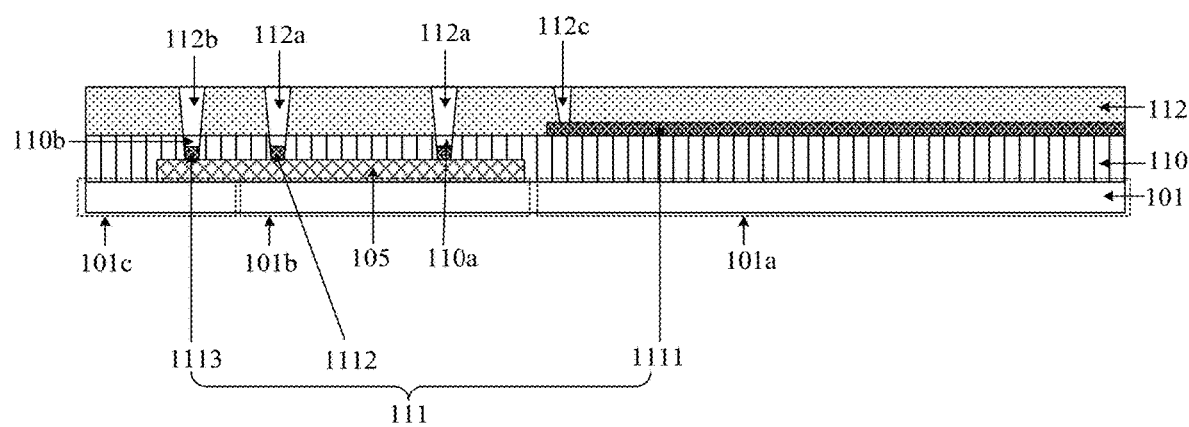
FIG. 28 is a cross-sectional view of a formed second overcoat.
Figure 29:
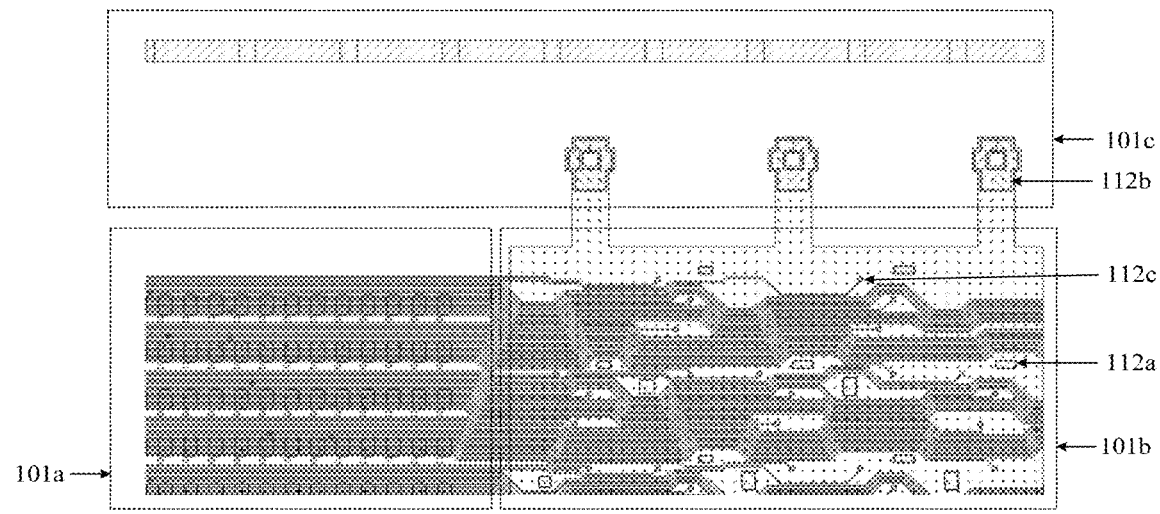
FIG. 29 is a top view of the formed second overcoat.
Figure 30:
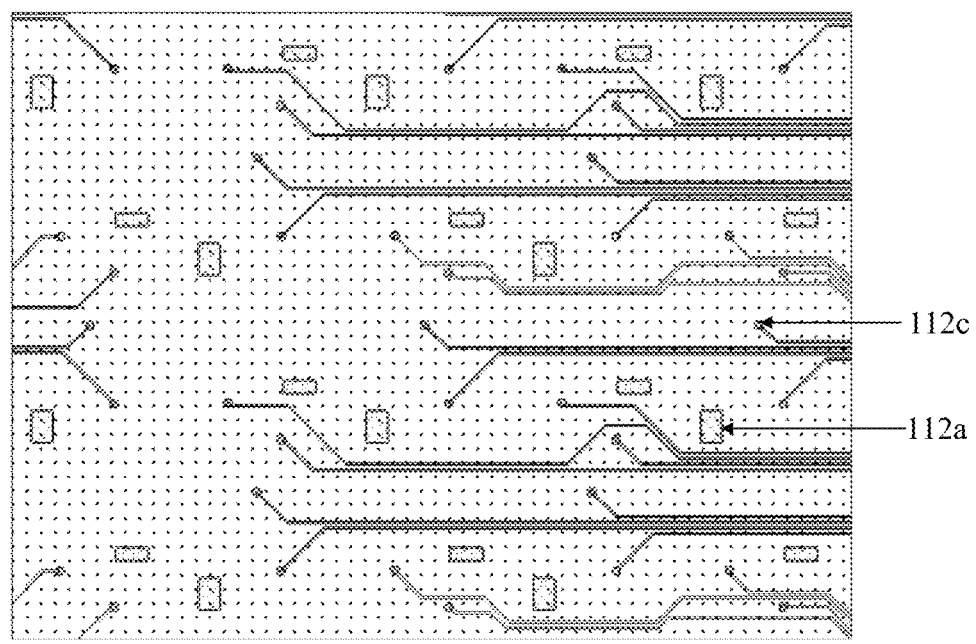
FIG. 30 is a schematic diagram of a portion of FIG. 29.

In the embodiment of the present disclosure, referring to FIG. 28 to FIG. 30, the second overcoat 112 may be formed on a side, distal from the base substrate 101, of the second signal transmission layer 111. The second overcoat 112 may have a plurality of third via holes 112*a*, a plurality of fourth via holes 112*b*, and a plurality of fifth via holes 112*c*. The third via hole 112*a* may expose the first transmission pattern 1112 disposed in the first via hole 110*a*. The fourth via hole 112*b* may expose the second transmission pattern 1113 disposed in the second via hole 110*b*. The fifth via hole 112*a* may expose the transmission trace 1111.

In 205, a first anode layer, a second anode layer, and a first signal transmission layer are formed on a side, distal from the base substrate, of the second overcoat.

Figure 31:
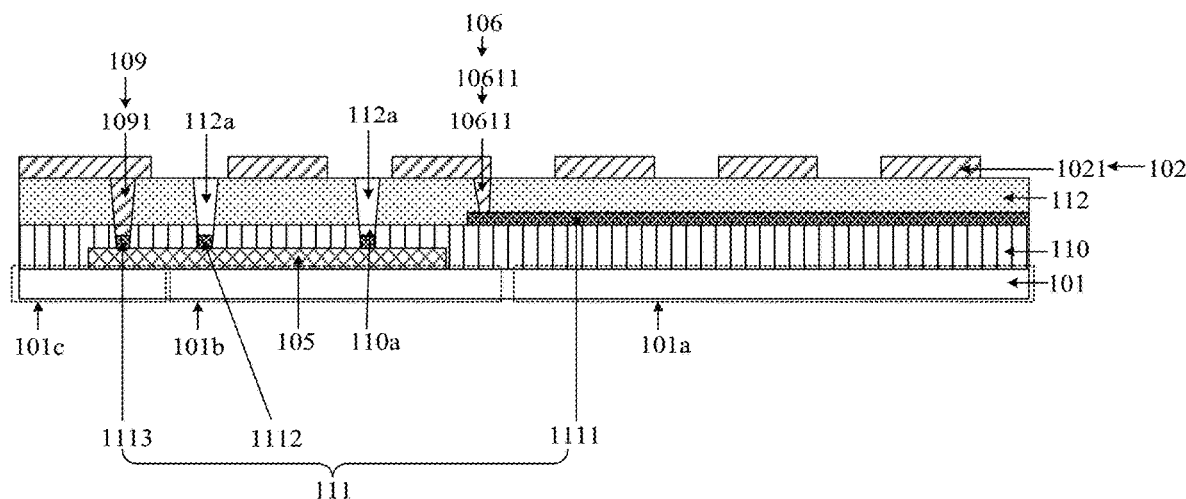
FIG. 31 is a cross-sectional view of a formed first anode layer, a formed second anode layer, and a formed first signal transmission layer.
Figure 32:
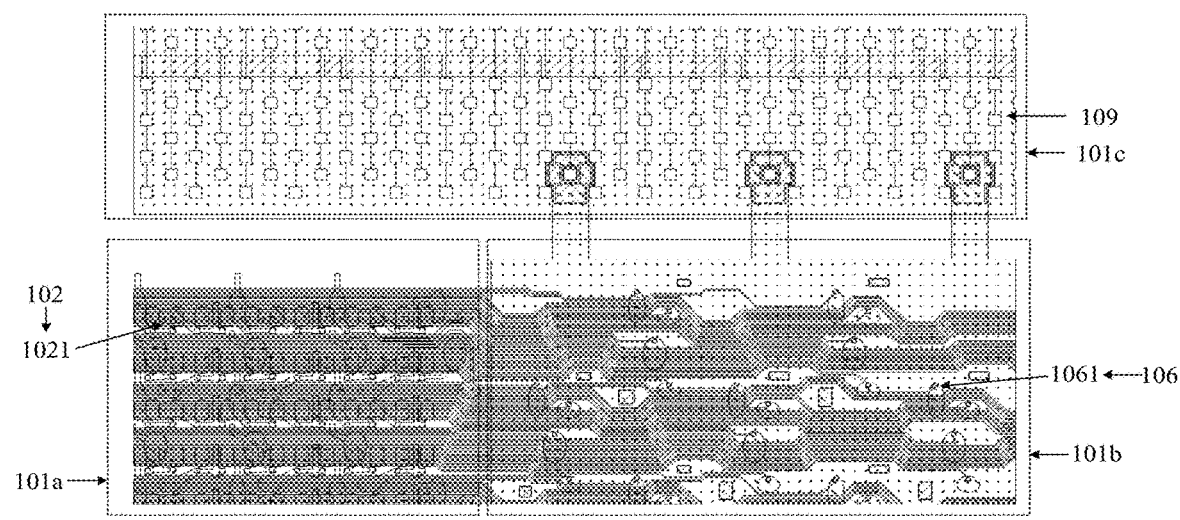
FIG. 32 is a top view of the formed first anode layer, the formed second anode layer, and the formed first signal transmission layer.
Figure 33:
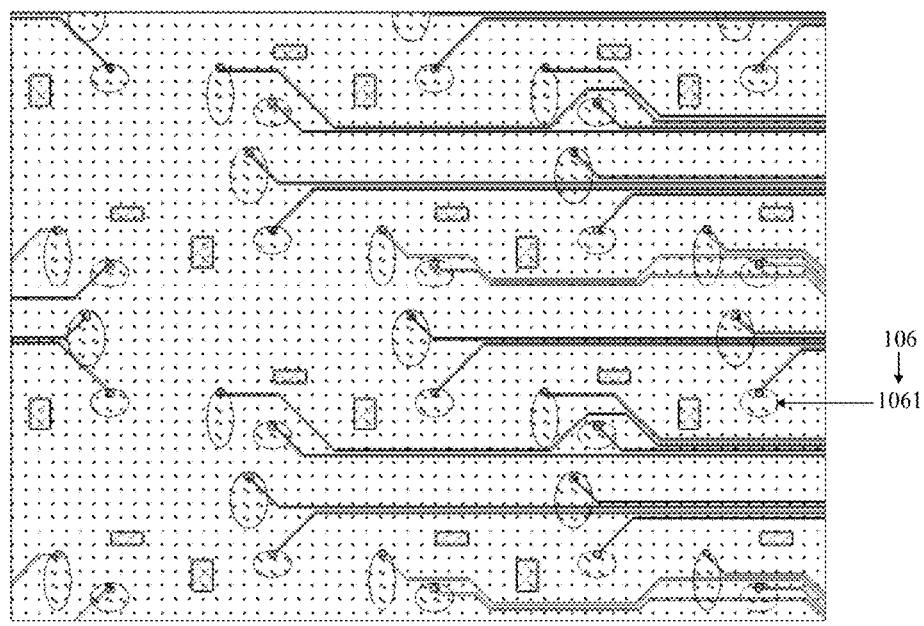
FIG. 33 is a schematic diagram of a portion of FIG. 32.

In the embodiment of the present disclosure, referring to FIG. 31 to FIG. 33, the first anode layer 102, the second anode layer 106, and the first signal transmission layer 109 may be formed on a side, distal from the base substrate 101, of the second overcoat 112 by a same patterning process. The first anode layer 102 may be disposed in a first display region 101*a* of the base substrate 101, the second anode layer 106 may be disposed in the second display region 101*b* of the base substrate 101, and the first signal transmission layer 109 may be disposed in the routing region 101*c*.

Referring to FIG. 31, the anode pattern 1061 of the second anode layer 106 includes a third connecting portion 10611, and the third connecting portion 10611 may be disposed in the fifth via hole 112*c* of the second overcoat 112. The second connecting portion 1091 of the first signal transmission layer 109 may be disposed in the fourth via hole 112*b* of the second overcoat 112 and the second via hole 110*b* of the first overcoat 110, and is connected to the second transmission pattern 1113 in the second via hole 110*b*.

In 206, a pixel define layer is formed on a side, distal from the base substrate, of the first anode layer, the second anode layer, and the first signal transmission layer.

Figure 34:
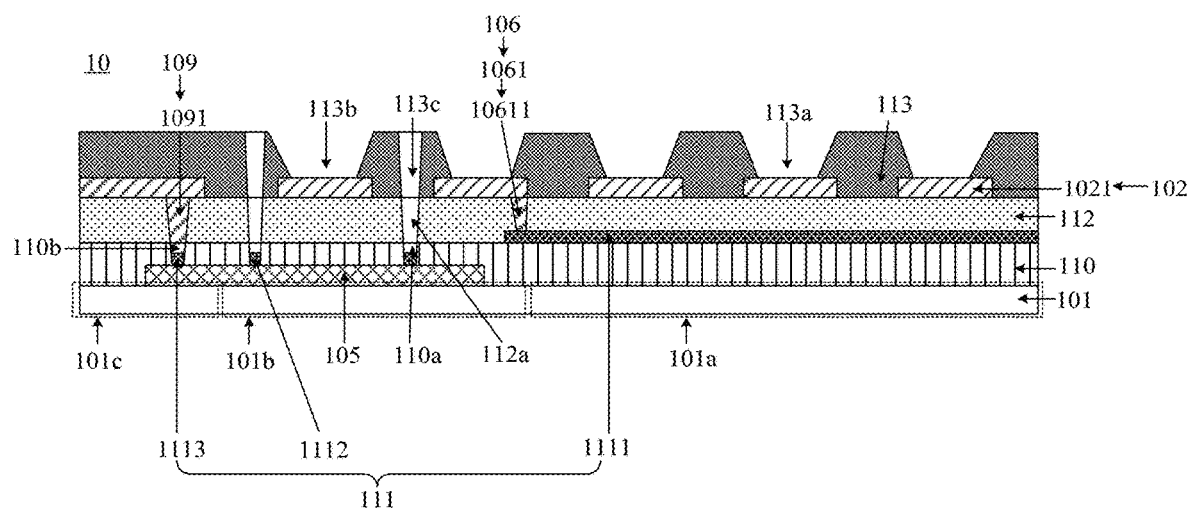
FIG. 34 is a cross-sectional view of a formed pixel define layer.
Figure 35:
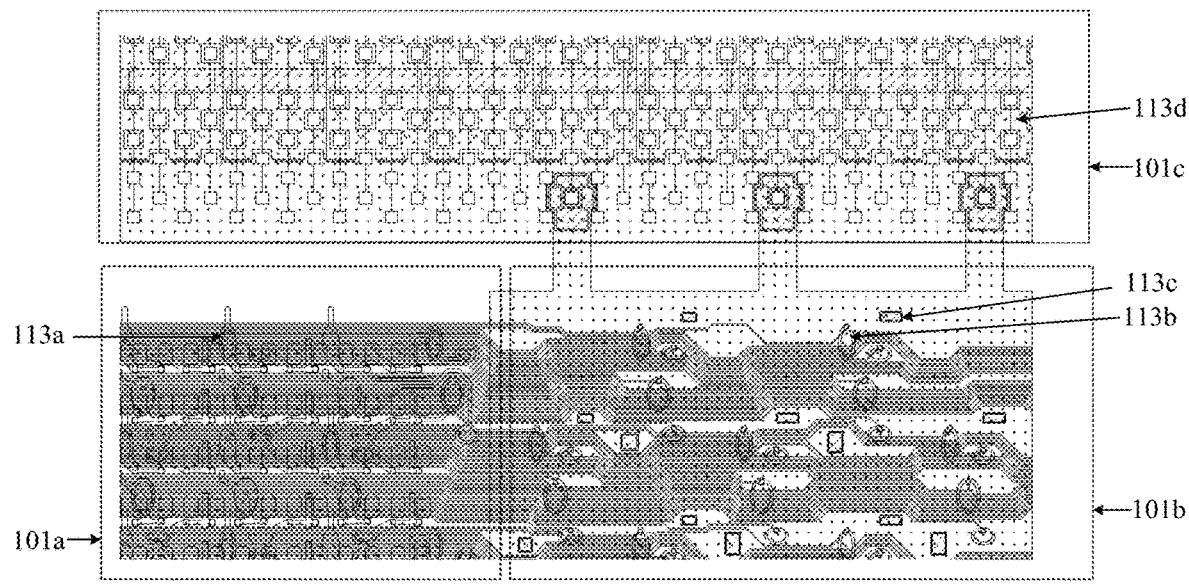
FIG. 35 is a top view of the formed pixel define layer.
Figure 36:
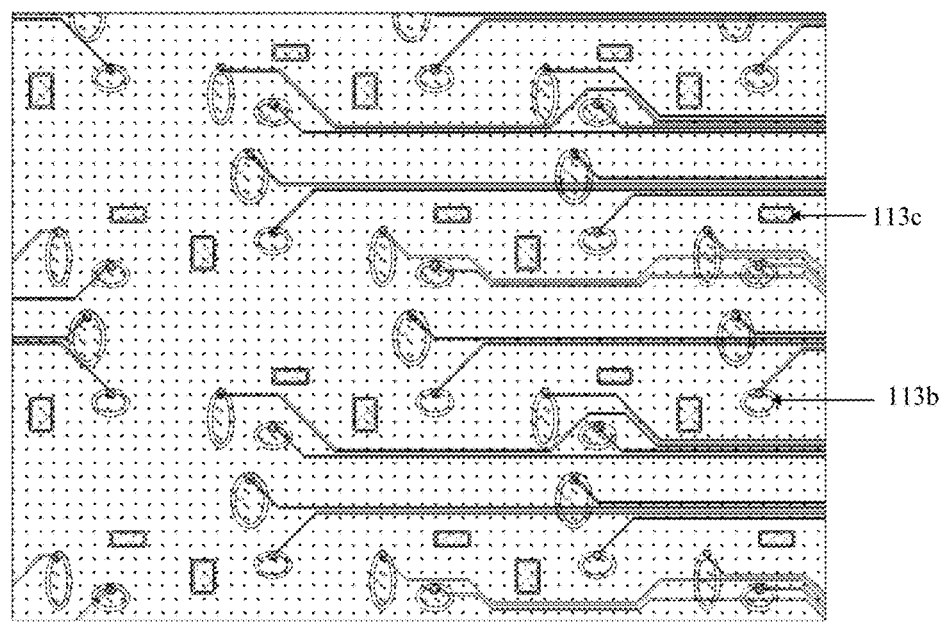
FIG. 36 is a schematic diagram of a portion of FIG. 35.

In the embodiment of the present disclosure, referring to FIG. 34 to FIG. 36, the pixel define layer 113 may be formed on a side, distal from the base substrate 101, of the first anode layer 102, the second anode layer 106, and the first signal transmission layer 109. The pixel define layer 113 may have a plurality of sixth via holes 113*a*, a plurality of seventh via holes 113*b*, a plurality of eighth via holes 113*c*, and a plurality of ninth via holes 113*d*. The sixth via hole 113*a*, the seventh via hole 113*b*, and the eighth via hole 113*c* are shown in FIG. 34, and the ninth via hole 113*d* is not shown in FIG. 34.

The sixth via hole 113*a* may expose part of the anode pattern 1021 of the first anode layer 102. The seventh via hole 113*b* may expose part of the anode pattern 1061 of the second anode layer 106. The eighth via hole 113*c* may be in communication with the third via hole 112*a* and the first via hole 110*a* and expose the first transmission pattern 1112.

In 207, a first hole injection layer, a first hole transport layer, a first light-emitting layer, a first electron transport layer, and a first electron injection layer are formed in a first display region, and a second hole injection layer, a second hole transport layer, a second light-emitting layer, a second electron transport layer, and a second electron injection layer are formed in a second display region.

Figure 37:
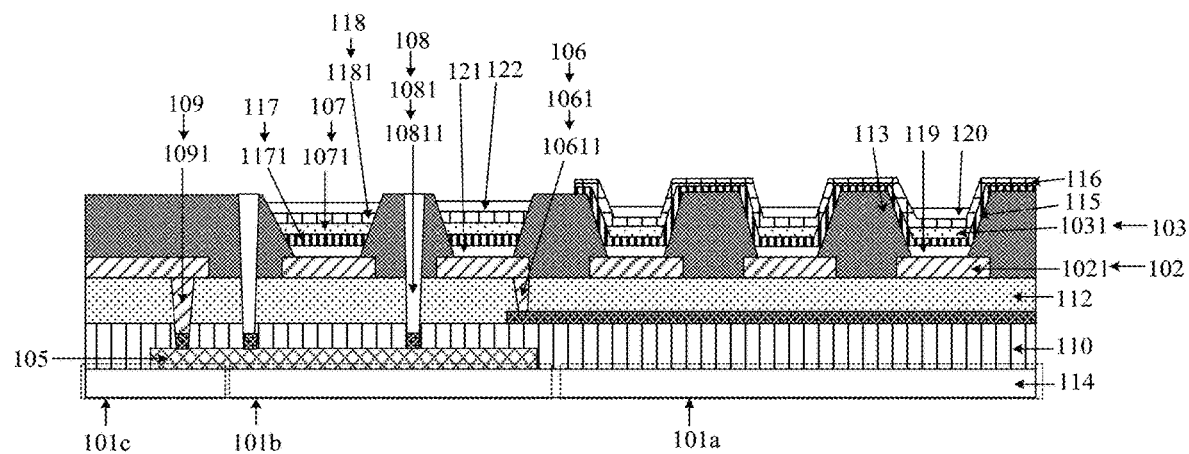
FIG. 37 is a cross-sectional view of a formed first hole injection layer, a formed first hole transport layer, a formed first light-emitting layer, a formed first electron transport layer, a formed first electron injection layer, a formed second hole injection layer, a formed second hole transport layer, a formed second light-emitting layer, a formed second electron transport layer and a formed second electron injection layer.
Figure 38:
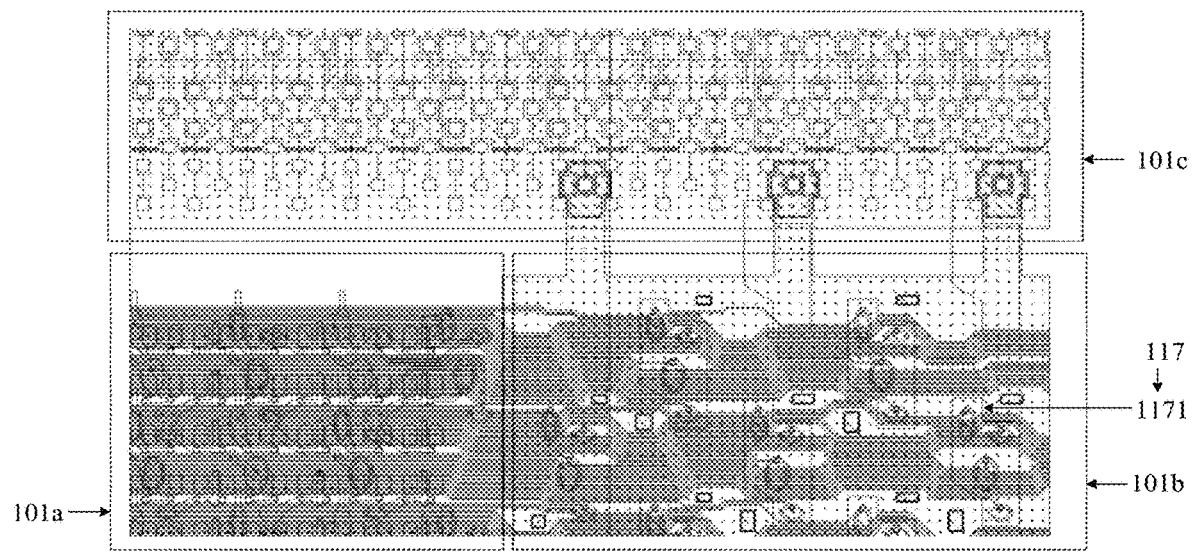
FIG. 38 is a top view of the formed first hole injection layer, the formed first hole transport layer, the formed first light-emitting layer, the formed first electron transport layer, the formed first electron injection layer, the formed second hole injection layer, the formed second hole transport layer, the formed second light-emitting layer, the formed second electron transport layer and the formed second electron injection layer.
Figure 39:
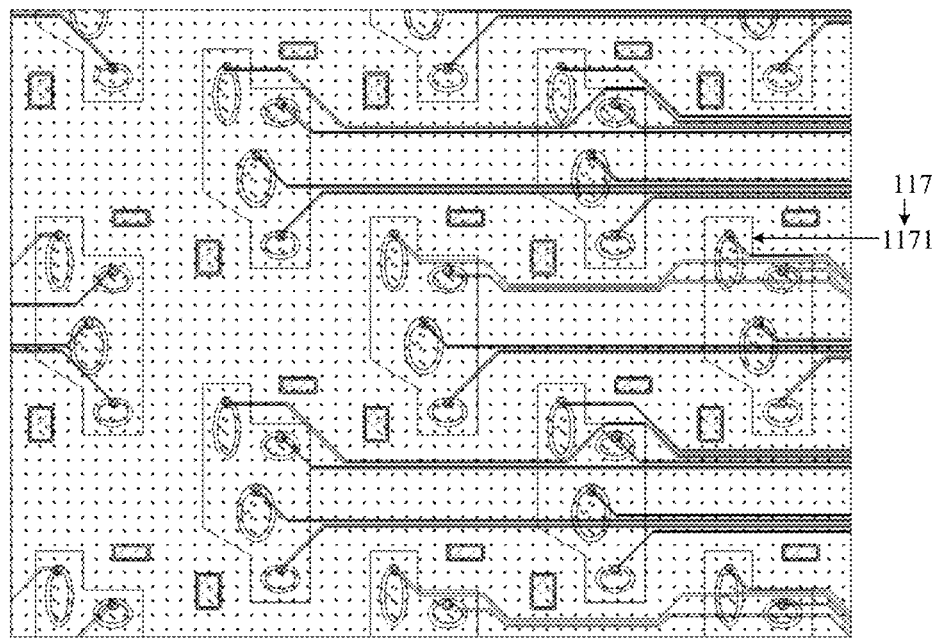
FIG. 39 is a schematic diagram of a portion of FIG. 38.

In the embodiment of the present disclosure, referring to FIG. 37 to FIG. 39, the first hole injection layer 119 and the second hole injection layer 121 may be disposed in the same layer, and the first hole transport layer 115 and the second hole transport layer 117 may be disposed in the same layer. The first light-emitting layer 103 and the second light-emitting layer 109 may be disposed in the same layer, the first electron transport layer 116 and the second electron transport layer 118 may be disposed in the same layer, and the first electron injection layer 120 and the second electron injection layer 122 may be disposed in the same layer.

That is, the first hole injection layer 119 and the second hole injection layer 121 may be prepared by a same patterning process. The first hole transport layer 115 and the second hole transport layer 117 may be prepared by a same patterning process. The first light-emitting layer 103 and the second light-emitting layer 109 may be prepared by a same patterning process. The first electron transport layer 116 and the second electron transport layer 118 may be prepared by a same patterning process. The first electron injection layer 120 and the second electron injection layer 122 may be prepared by a same patterning process.

In the embodiment of the present disclosure, each the first hole injection layer 119 and the second hole injection layer 121 may include a plurality of hole injection patterns spaced apart. In addition, the first hole injection layer 119 and the second hole injection layer 121 may be prepared by using an FMM. Each of the first electron injection layer 120 and the second electron injection layer 122 may include a plurality of electron injection patterns spaced apart. In addition, the first electron injection layer 120 and the second electron injection layer 122 may be prepared by using the FMM.

The first hole transport layer 115 and the first electron transport layer 116 may have a plate structure. The second hole transport layer 117 may include a plurality of hole transport patterns 1171. The second electron transport layer 118 may include a plurality of electron transport patterns 1181.

An orthographic projection of the hole transport pattern 1171 on the base substrate 101 covers an orthographic projection of a light-emitting region b11 of a first sub-pixel b1 disposed in the second display region 101*b* on the base substrate 101, and an orthographic projection of the electron transport pattern 1181 on the base substrate 101 covers the orthographic projection of the light-emitting region b11 of the first sub-pixel b1 disposed in the second display region 101*b* on the base substrate 101. In addition, the orthographic projection of the hole transport pattern 1171 on the base substrate 101 is not overlapped with an orthographic projection of the eighth via hole 113*c* in the pixel define layer 113 on the base substrate 101, and the orthographic projection of the electron transport pattern 1181 on the base substrate 101 is not overlapped with the orthographic projection of the eighth via hole 113*c* in the pixel define layer 113 on the base substrate 101.

In 208, a first cathode layer is formed in the first display region, and a third cathode layer is formed in the second display region.

Figure 40:
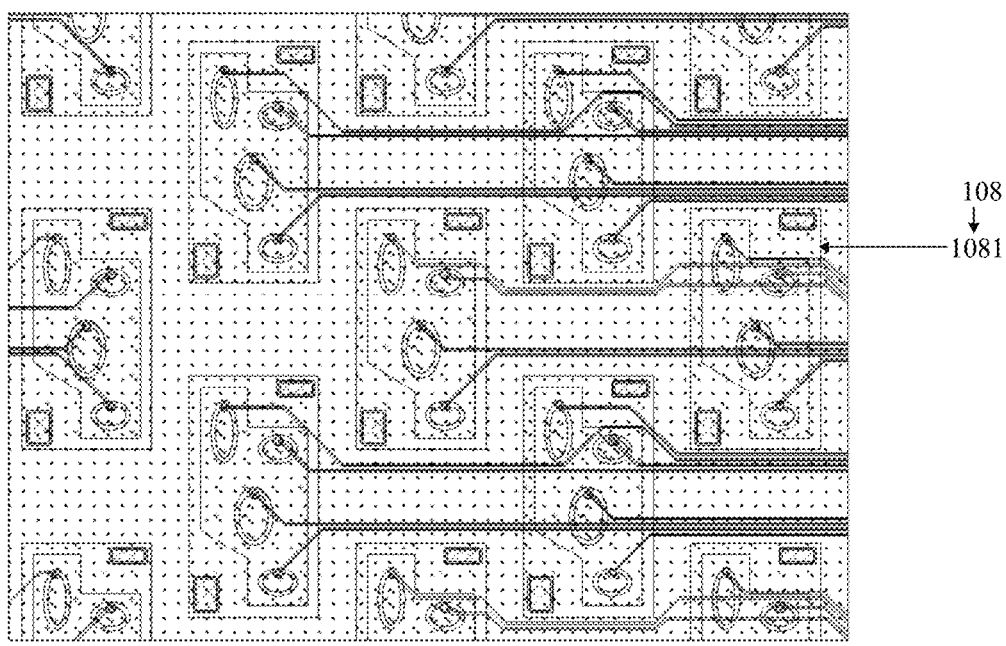
FIG. 40 is a schematic diagram of a portion of FIG. 12.

In the embodiment of the present disclosure, referring to FIG. 10, FIG. 12, and FIG. 40, the first cathode layer 104 and the third cathode layer 108 may be disposed in the same layer. That is, the first cathode layer 104 and the third cathode layer 108 may be prepared by a same patterning process.

The first cathode layer 104 may be connected to the first signal transmission layer 109 disposed in the routing region 101*c* via the ninth via hole 113*d* in the pixel define layer 113. The third cathode layer 108 includes a plurality of first cathode patterns 1081 spaced apart. A first connecting portion 10811 of the first cathode pattern 1081 may be disposed in the eighth via hole 113c, the third via hole 112a, and the first via hole 110a, and connected to the first transmission pattern 1112 in the first via hole 110a.

In the embodiment of the present disclosure, prior to step 201, the method for manufacturing a display panel may further include: sequentially forming a barrier layer 123, a buffer layer 124, a poly layer 125, a first gate insulator layer 126, a first gate layer 127, a second gate insulator layer 128, a second gate layer 129, an inter-layer dielectric layer 130, a source-drain electrode layer 131, and a third overcoat 114 on a side distal from the base substrate 101.

In summary, the embodiment of the present disclosure provides the method for preparing a display panel. A plurality of first cathode patterns of a third cathode layer of the display panel prepared by the preparing method are spaced apart, such that the first cathode patterns will not entirely cover the second display region. In comparison with the cathode layer entirely covering the second display region, the impact on a light transmittance is effectively reduced, and the imaging effect of a camera disposed in the second display region is enhanced.

Figure 41:
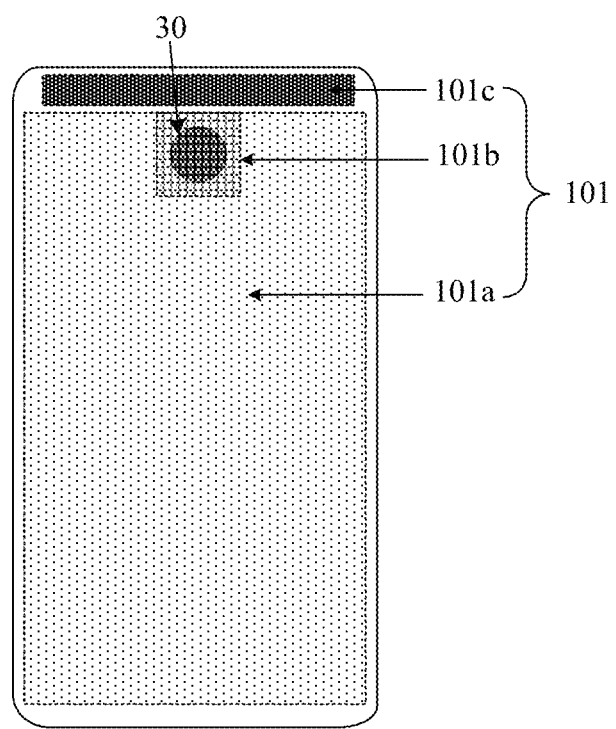
FIG. 41 is a schematic structural diagram of a display device according to an embodiment of the present disclosure.

FIG. 41 is a schematic structural diagram of a display device according to an embodiment of the present disclosure. Referring to FIG. 41, the display device may include: an image sensor 30 and the display panel 10 according to the above embodiment. The image sensor 30 may be disposed on a side, distal from the second anode layer 106, of the base substrate 101 in the display panel 10 and disposed in the second display region 101b of the base substrate 101. The image sensor 30 may be a front camera of the display device, and configured to capture an image.

Optionally, the display device may be any product or component with a display function, such as an OLED display device, a liquid crystal display device, electronic paper, a mobile phone, a tablet, a television, a monitor, a laptop, a digital photo frame or a navigator.

Described above are merely exemplary embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display panel, comprising:
a base substrate comprising a first display region, a second display region, and a routing region;
a first anode layer, a first light-emitting layer, and a first cathode layer disposed in the first display region and sequentially stacked in a direction going away from the base substrate;
a second cathode layer, a second anode layer, a second light-emitting layer, and a third cathode layer disposed in the second display region and sequentially stacked in the direction going away from the base substrate, wherein the third cathode layer comprises: a plurality of first cathode patterns spaced apart, at least one of the plurality of first cathode patterns comprising a first connecting portion via which the at least one of the plurality of first cathode patterns is connected to the second cathode layer; the second anode layer, the second light-emitting layer and the third cathode layer being dividable into a plurality of first sub-pixels, an orthographic projection of a light-emitting region of at least one of the plurality of first sub-pixels on the base substrate being within an overlapping region between the second cathode layer and the third cathode layer; and
a first signal transmission layer disposed in the routing region, wherein a signal transmitted by the first signal transmission layer is different from signals transmitted by the first anode layer and the second anode layer;
wherein an orthographic projection of the first signal transmission layer on the base substrate is partially overlapped with an orthographic projection of the second cathode layer on the base substrate, the first signal transmission layer comprises: a second connecting portion, the first signal transmission layer being connected to the second cathode layer via the second connecting portion; the orthographic projection of the first signal transmission layer on the base substrate is partially overlapped with an orthographic projection of the first cathode layer on the base substrate, and the first signal transmission layer is connected to the first cathode layer; and the first signal transmission layer is further configured to receive a power supply signal.

2. The display panel according to claim 1, wherein an orthographic projection of at least one of the plurality of first cathode patterns on the base substrate covers the orthographic projection of the light-emitting region of at least one of the first sub-pixels on the base substrate.

3. The display panel according to claim 1, wherein the first anode layer, the first light-emitting layer, and the first cathode layer are dividable into a plurality of second sub-pixels, an orthographic projection of a light-emitting region of at least one of the plurality of second sub-pixels on the base substrate being within the orthographic projection of the first cathode layer on the base substrate.

4. The display panel according to claim 1, wherein the first sub-pixels are categorizable into a plurality of sub-pixel groups, each of the sub-pixel groups comprising a plurality of first sub-pixels, and light-emitting regions of the first sub-pixels in at least one of the sub-pixel groups being arranged in three rows and three columns.

5. The display panel according to claim 4, wherein an orthographic projection of at least one of the plurality of first cathode patterns on the base substrate covers an orthographic projection of one sub-pixel group on the base substrate, and a shape of the at least one of the plurality of first cathode patterns is a first shape, the first shape being a centrosymmetric shape or an axisymmetric shape.

6. The display panel according to claim 4, wherein an orthographic projection of at least one of the plurality of first cathode patterns on the base substrate covers an orthographic projection of one sub-pixel group on the base substrate, and a shape of the at least one of the plurality of first cathode patterns is a second shape, the second shape being formed by connecting a plurality of straight line segments and a plurality of arc line segments end to end; and
an extending direction of at least one of the straight line segments being parallel to an extending direction of a boundary of the light-emitting region of at least one the first sub-pixels in the sub-pixel group.

7. The display panel according to claim 4, wherein the sub-pixel group comprises: one first sub-pixel of a first color, two first sub-pixels of a second color, and one first sub-pixel of a third color; and
in at least one of the sub-pixel groups, the light-emitting region of the first sub-pixel of the first color is disposed in row 3 and column 1, the light-emitting region of one first sub-pixel of the second color is disposed in row 1 and column 3, the light-emitting region of the other first sub-pixel of the second color is disposed in row 3 and column 3, and the light-emitting region of the first sub-pixel of the third color is disposed in row 2 and column 2; or in the at least one of the sub-pixel groups, the light-emitting region of the first sub-pixel of the first color is disposed in row 2 and column 3, the light-emitting region of one first sub-pixel of the second color is disposed in row 1 and column 2, the light-emitting region of the other first sub-pixel of the second color is disposed in row 3 and column 2, and the light-emitting region of the first sub-pixel of the third color is disposed in row 2 and column 1.

8. The display panel according to claim 4, wherein in at least one of the sub-pixel groups, a distance between the first connecting portion and the light-emitting region of at least one of the first sub-pixels in the sub-pixel group in a direction parallel to a bearing surface of the base substrate is greater than or equal to 2.5 microns and less than or equal to 15 microns.

9. The display panel according to claim 1, wherein the second cathode layer comprises: a joint, an orthographic projection of the joint on the base substrate being partially overlapped with the orthographic projection of the first signal transmission layer on the base substrate; the display panel further comprises: a first overcoat disposed between the second cathode layer and the third cathode layer, wherein the first overcoat is provided with a plurality of first via holes and a plurality of second via holes;

an orthographic projection of at least one of the plurality of first via holes on the base substrate being within the second display region, the orthographic projection of the at least one of the plurality of first via holes on the base substrate being not overlapped with the orthographic projection of the light-emitting region of the first sub-pixel on the base substrate, and part of the first connecting portion being disposed in the at least one of the plurality of first via holes; and an orthographic projection of at least one of the plurality of second via holes on the base substrate being within the routing region, the orthographic projection of the at least one of the plurality of second via holes on the base substrate being within the orthographic projection of the joint on the base substrate, and being within the orthographic projection of the first signal transmission layer on the base substrate, and part of the second connecting portion being disposed in the at least one of the plurality of second via holes.

10. The display panel according to claim 9, wherein the display panel further comprises: a plurality of pixel circuits disposed in the first display region, and a second signal transmission layer disposed between the first overcoat and the third cathode layer;

wherein the pixel circuit is electrically connected to the second anode layer via the second signal transmission layer;

and the second signal transmission layer comprises: a plurality of transmission traces;

wherein one end of the transmission trace is connected to the second anode layer, and the other end of the transmission trace is connected to the pixel circuit.

11. The display panel according to claim 10, wherein the second signal transmission layer further comprises: a plurality of first transmission patterns disposed in the second display region, wherein at least one of the plurality of first transmission patterns is disposed in at least one of the plurality of first via holes and configured to electrically connect the second cathode layer and the first connecting portion.

12. The display panel according to claim 11, wherein the second signal transmission layer further comprises: a plurality of second transmission patterns disposed in the routing region, wherein at least one of the plurality of second transmission patterns is disposed in at least one of the plurality of second via holes and configured to electrically connect the second cathode layer and the second connecting portion.

13. The display panel according to claim 10, wherein the display panel further comprises: a second overcoat disposed between the second signal transmission layer and the third cathode layer;

wherein the second overcoat is provided with a plurality of third via holes, a first overlapping region being between an orthographic projection of at least one of the plurality of third via holes on the base substrate and the orthographic projection of at least one of the plurality of first via holes on the base substrate, a ratio of an area of the first overlapping region to an area of the orthographic projection of the at least one of the plurality of first via holes on the base substrate being greater than or equal to 80%, and part of the first connecting portion being disposed in the at least one of the plurality of third via holes and configured to connect the second signal transmission layer and the third cathode layer; and the second overcoat is further provided with a plurality of fourth via holes, a second overlapping region being between an orthographic projection of at least one of the plurality of fourth via holes on the base substrate and the orthographic projection of at least one of the plurality of second via holes on the base substrate, a ratio of an area of the second overlapping region to an area of the orthographic projection of the at least one of the plurality of second via holes on the base substrate being greater than or equal to 80%, and part of the second connecting portion being disposed in the at least one of the plurality of fourth via holes and configured to connect the first signal transmission layer and the second signal transmission layer.

14. The display panel according to claim 10, wherein the second overcoat is further provided with a plurality of fifth via holes; the second anode layer comprises: a third connecting portion disposed in at least one of the plurality of fifth via holes, and the second anode layer being electrically connected to the second signal transmission layer via the third connecting portion.

15. The display panel according to claim 9, wherein the display panel further comprises: a pixel define layer;

wherein the pixel define layer is provided with a plurality of sixth via holes, an orthographic projection of at least one of the plurality of sixth via holes on the base substrate being covered by an orthographic projection of the first light-emitting layer on the base substrate, and the first light-emitting layer being in contact with the first anode layer via at least one of the plurality of sixth via holes; and the pixel define layer is further provided with a plurality of seventh via holes, an orthographic projection of at least one of the plurality of seventh via holes on the base substrate being covered by an orthographic projection of the second light-emitting layer on the base substrate, and the second light-emitting layer being in contact with the second anode layer via the at least one of the plurality of seventh via holes;

the pixel define layer is further provided with a plurality of eighth via holes, a third overlapping region being between an orthographic projection of the at least one of the plurality of eighth via holes on the base substrate and the orthographic projection of at least one of the plurality of first via holes on the base substrate, and a ratio of an area of the third overlapping region to an area of the orthographic projection of the at least one of the plurality of first via holes on the base substrate being greater than or equal to 80%;

the pixel define layer is further provided with a plurality of ninth via holes, an orthographic projection of at least one of the plurality of ninth via holes on the base substrate being within the orthographic projection of the first signal transmission layer on the base substrate; and the first cathode layer being electrically connected to the first signal transmission layer via the at least one of the plurality of ninth via holes.

16. The display panel according to claim 15, wherein the display panel further comprises: a third overcoat disposed on a side, proximal to the base substrate, of the second cathode layer;

the first signal transmission layer is provided with a plurality of tenth via holes, the third overcoat being exposed by at least one of the plurality of tenth via holes; and an orthographic projection of the second connecting portion on the base substrate surrounds an orthographic projection of at least one of the plurality of tenth via holes on the base substrate.

17. The display panel according to claim 1, wherein the third cathode layer further comprises: a plurality of second cathode patterns spaced apart, an orthographic projection of at least one of the plurality of second cathode patterns on the base substrate being not overlapped with the orthographic projection of the light-emitting region of at least one of the plurality of first sub-pixels on the base substrate.

18. The display panel according to claim 1, wherein the display panel further comprises: a first hole transport layer and a first electron transport layer disposed in the first display region, and a second hole transport layer and a second electron transport layer disposed in the second display region;

the second hole transport layer comprising: a plurality of hole transport patterns spaced apart, an area of the hole transport pattern being smaller than an area of the first cathode pattern;

the second electron transport layer comprising: a plurality of electron transport patterns spaced apart, an area of the electron transport pattern being smaller than the area of the first cathode pattern;

an orthographic projection of the hole transport pattern on the base substrate covers the orthographic projection of the light-emitting region of the first sub-pixel on the base substrate, and an orthographic projection of the electron transport pattern on the base substrate covers the orthographic projection of the light-emitting region of the first sub-pixel on the base substrate; and the orthographic projection of the hole transport pattern on the base substrate is not overlapped with an orthographic projection of the first connecting portion on the base substrate, and the orthographic projection of the electron transport pattern on the base substrate is not overlapped with the orthographic projection of the first connecting portion on the base substrate.

19. The display panel according to claim 1, wherein the second cathode layer and the second signal transmission layer in the display panel are both made of a transparent conductive material; and/or the first anode layer, the second anode layer, and the first signal transmission layer are disposed in a same layer; the first light-emitting layer and the second light-emitting layer are disposed in a same layer; and the first cathode layer and the third cathode layer are disposed in a same layer.

20. A display device, wherein the display device comprises: an image sensor and the display panel according to claim 1; and the image sensor is disposed on a side, distal from a second anode layer, of the base substrate in the display panel, and disposed in a third display region of the base substrate.

* * * * *